United States Patent
Choi et al.

(10) Patent No.: US 9,748,483 B2
(45) Date of Patent: Aug. 29, 2017

(54) DEPOSITION SOURCE AND ORGANIC LAYER DEPOSITION APPARATUS INCLUDING THE SAME

(71) Applicant: SAMSUNG DISPLAY CO., LTD., Yongin-si, Gyeonggi-do (KR)

(72) Inventors: Young-Mook Choi, Yongin-si (KR); Hee-Cheol Kang, Yongin-si (KR); Chae-Woong Kim, Yongin-si (KR); Mu-Hyun Kim, Yongin-si (KR); Dong-Kyu Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/946,686

(22) Filed: Nov. 19, 2015

(65) Prior Publication Data
US 2016/0079534 A1    Mar. 17, 2016

Related U.S. Application Data

(63) Continuation of application No. 13/328,524, filed on Dec. 16, 2011, now abandoned.

(30) Foreign Application Priority Data

Jan. 12, 2011    (KR) .................. 10-2011-0003155

(51) Int. Cl.
*C23C 14/12*    (2006.01)
*H01L 51/00*    (2006.01)
(Continued)

(52) U.S. Cl.
CPC .......... *H01L 51/0004* (2013.01); *C23C 14/12* (2013.01); *C23C 14/243* (2013.01); *H01L 51/56* (2013.01)

(58) Field of Classification Search
CPC .................................................... H01L 51/005
See application file for complete search history.

(56) References Cited

U.S. PATENT DOCUMENTS 4,416,217 A    11/1983    Nakamura et al.
4,468,648 A    8/1984    Uchikune
(Continued)

FOREIGN PATENT DOCUMENTS

CN    2425263 Y    3/2001
CN    1476279 A    2/2004
(Continued)

OTHER PUBLICATIONS

JP 2005-293968, 2005, machine translation.*
(Continued)

*Primary Examiner* — Robert Vetere
(74) *Attorney, Agent, or Firm* — Lewis Roca Rothgerber Christie LLP

(57) ABSTRACT

A deposition source and an organic layer deposition apparatus that may be simply applied to the manufacture of large-sized display apparatuses on a mass scale and may prevent or substantially prevent deposition source nozzles from being blocked during deposition of a deposition material, thereby improving manufacturing yield and deposition efficiency. A deposition source includes a first deposition source including a plurality of first deposition source nozzles, and a second deposition source including a plurality of second deposition source nozzles wherein the plurality of first deposition source nozzles and the plurality of second deposition source nozzles are tilted toward each other.

33 Claims, 8 Drawing Sheets

(51) Int. Cl.
    *C23C 14/24* (2006.01)
    *H01L 51/56* (2006.01)

(56) References Cited

U.S. PATENT DOCUMENTS

| | | |
|---|---|---|
| 4,687,939 A | 8/1987 | Miyauchi et al. |
| 4,792,378 A | 12/1988 | Rose et al. |
| 4,901,667 A | 2/1990 | Suzuki et al. |
| 5,454,847 A | 10/1995 | Jacoboni et al. |
| 5,460,654 A | 10/1995 | Kikkawa et al. |
| 5,487,609 A | 1/1996 | Asada |
| 5,742,129 A | 4/1998 | Nagayama et al. |
| 5,774,145 A * | 6/1998 | Morita ............... B41J 2/1404 347/40 |
| 5,909,995 A | 6/1999 | Wolf et al. |
| 6,045,671 A | 4/2000 | Wu et al. |
| 6,091,195 A | 7/2000 | Forrest et al. |
| 6,099,649 A | 8/2000 | Schmitt et al. |
| 6,222,198 B1 | 4/2001 | Brown |
| 6,274,198 B1 | 8/2001 | Dautartas |
| 6,280,821 B1 | 8/2001 | Kadunce et al. |
| 6,371,451 B1 | 4/2002 | Choi |
| 6,417,034 B2 | 7/2002 | Kitazume et al. |
| 6,443,597 B1 | 9/2002 | Natori |
| 6,483,690 B1 | 11/2002 | Nakajima et al. |
| 6,541,130 B2 | 4/2003 | Fukuda |
| 6,554,969 B1 | 4/2003 | Chong |
| 6,579,422 B1 | 6/2003 | Kakinuma |
| 6,589,673 B1 | 7/2003 | Kido et al. |
| 6,650,023 B2 | 11/2003 | Kim |
| 6,699,324 B1 | 3/2004 | Berdin et al. |
| 6,749,906 B2 | 6/2004 | Van Slyke |
| 6,776,847 B2 | 8/2004 | Yamazaki et al. |
| 6,837,939 B1 | 1/2005 | Klug et al. |
| 6,878,209 B2 | 4/2005 | Himeshima et al. |
| 6,946,783 B2 | 9/2005 | Kim |
| 6,995,035 B2 | 2/2006 | Cok et al. |
| 7,006,202 B2 | 2/2006 | Byun et al. |
| RE39,024 E | 3/2006 | Takahashi |
| 7,078,070 B2 | 7/2006 | Peng |
| 7,199,520 B2 | 4/2007 | Fujii et al. |
| 7,282,855 B2 | 10/2007 | Park et al. |
| 7,322,248 B1 | 1/2008 | Long |
| 7,495,389 B2 | 2/2009 | Noguchi et al. |
| 7,601,439 B2 | 10/2009 | Chun et al. |
| 7,776,457 B2 | 8/2010 | Lee et al. |
| 7,872,256 B2 | 1/2011 | Sung et al. |
| 7,910,386 B2 | 3/2011 | Shiang et al. |
| 7,964,037 B2 | 6/2011 | Fukuda et al. |
| 8,022,448 B1 | 9/2011 | Luu et al. |
| 8,128,753 B2 | 3/2012 | Bulovic et al. |
| 8,137,466 B2 | 3/2012 | Kang et al. |
| 8,188,476 B2 | 5/2012 | Takagi et al. |
| 8,193,011 B2 | 6/2012 | Kang et al. |
| 8,673,077 B2 | 3/2014 | Sonoda et al. |
| 8,833,294 B2 | 9/2014 | Lee et al. |
| 8,894,458 B2 | 11/2014 | Song et al. |
| 2001/0004186 A1 | 6/2001 | Song et al. |
| 2001/0006827 A1 | 7/2001 | Yamazaki et al. |
| 2001/0019807 A1 | 9/2001 | Yamada et al. |
| 2001/0026638 A1 | 10/2001 | Sangu et al. |
| 2001/0034175 A1 | 10/2001 | Miyazaki et al. |
| 2002/0011785 A1 | 1/2002 | Tang et al. |
| 2002/0017245 A1 | 2/2002 | Tsubaki et al. |
| 2002/0033136 A1 | 3/2002 | Savage et al. |
| 2002/0036759 A1 | 3/2002 | Ise et al. |
| 2002/0050061 A1 | 5/2002 | Komyoji et al. |
| 2002/0076847 A1 | 6/2002 | Yamada et al. |
| 2002/0168577 A1 | 11/2002 | Yoon |
| 2002/0179013 A1 | 12/2002 | Kido et al. |
| 2002/0187253 A1 | 12/2002 | Marcus et al. |
| 2002/0194727 A1 | 12/2002 | Cho et al. |
| 2002/0197393 A1 | 12/2002 | Kuwabara |
| 2003/0021886 A1 | 1/2003 | Baele |
| 2003/0101932 A1 | 6/2003 | Kang |
| 2003/0101937 A1 | 6/2003 | Van Slyke et al. |
| 2003/0117602 A1 | 6/2003 | Kobayashi et al. |
| 2003/0118950 A1 | 6/2003 | Chao et al. |
| 2003/0124764 A1 | 7/2003 | Yamazaki et al. |
| 2003/0151637 A1 | 8/2003 | Nakamura et al. |
| 2003/0164934 A1 | 9/2003 | Nishi et al. |
| 2003/0168013 A1 | 9/2003 | Freeman et al. |
| 2003/0173896 A1 | 9/2003 | Grushin et al. |
| 2003/0221614 A1 | 12/2003 | Kang et al. |
| 2003/0221620 A1 | 12/2003 | Yamazaki |
| 2003/0232563 A1 | 12/2003 | Kamiyama et al. |
| 2004/0016907 A1 | 1/2004 | Shi |
| 2004/0028349 A1 | 2/2004 | Nagasaka et al. |
| 2004/0029028 A1 | 2/2004 | Shimizu |
| 2004/0056244 A1 | 3/2004 | Marcus et al. |
| 2004/0062856 A1 | 4/2004 | Marcus et al. |
| 2004/0086639 A1 | 5/2004 | Grantham et al. |
| 2004/0096771 A1 | 5/2004 | Kashiwagi et al. |
| 2004/0115338 A1 * | 6/2004 | Yoneda ............... C23C 14/042 427/66 |
| 2004/0115342 A1 | 6/2004 | Shigemura |
| 2004/0123804 A1 | 7/2004 | Yamazaki et al. |
| 2004/0127066 A1 | 7/2004 | Jung |
| 2004/0134428 A1 | 7/2004 | Sasaki et al. |
| 2004/0142108 A1 | 7/2004 | Atobe et al. |
| 2004/0144321 A1 | 7/2004 | Grace et al. |
| 2004/0157167 A1 | 8/2004 | Morii |
| 2004/0183435 A1 | 9/2004 | Ohshita |
| 2004/0194702 A1 | 10/2004 | Sasaki et al. |
| 2004/0195530 A1 | 10/2004 | Kwak et al. |
| 2004/0216673 A1 | 11/2004 | Sakata et al. |
| 2004/0255857 A1 | 12/2004 | Chow et al. |
| 2004/0263547 A1 | 12/2004 | Sugahara |
| 2004/0263771 A1 | 12/2004 | Jeong et al. |
| 2005/0001546 A1 | 1/2005 | Yamaguchi |
| 2005/0016461 A1 * | 1/2005 | Klug ............... C23C 14/12 118/726 |
| 2005/0031836 A1 | 2/2005 | Hirai |
| 2005/0037136 A1 | 2/2005 | Yamamoto |
| 2005/0039684 A1 | 2/2005 | Yi et al. |
| 2005/0072359 A1 | 4/2005 | Kim |
| 2005/0072361 A1 | 4/2005 | Yang et al. |
| 2005/0079418 A1 | 4/2005 | Kelley et al. |
| 2005/0110400 A1 | 5/2005 | Nakamura |
| 2005/0118788 A1 | 6/2005 | Kuwahara et al. |
| 2005/0129489 A1 | 6/2005 | Quan et al. |
| 2005/0153472 A1 | 7/2005 | Yotsuya |
| 2005/0166842 A1 | 8/2005 | Sakamoto |
| 2005/0166844 A1 | 8/2005 | Gralenski |
| 2005/0183670 A1 | 8/2005 | Grantham et al. |
| 2005/0186330 A1 | 8/2005 | Kim et al. |
| 2005/0213021 A1 | 9/2005 | Myoung |
| 2005/0217584 A1 | 10/2005 | Abiko et al. |
| 2005/0229848 A1 | 10/2005 | Shinriki et al. |
| 2005/0244580 A1 | 11/2005 | Cok et al. |
| 2005/0263074 A1 | 12/2005 | Masuda et al. |
| 2005/0280356 A1 | 12/2005 | Murayama et al. |
| 2006/0011136 A1 | 1/2006 | Yamazaki et al. |
| 2006/0012280 A1 | 1/2006 | Kang et al. |
| 2006/0012771 A1 | 1/2006 | Jeong |
| 2006/0022590 A1 | 2/2006 | Aziz et al. |
| 2006/0040132 A1 | 2/2006 | Liao et al. |
| 2006/0045958 A1 | 3/2006 | Abiko et al. |
| 2006/0066231 A1 | 3/2006 | Nishikawa et al. |
| 2006/0090705 A1 | 5/2006 | Kim |
| 2006/0102078 A1 | 5/2006 | Fairbairn et al. |
| 2006/0103289 A1 | 5/2006 | Kim et al. |
| 2006/0110544 A1 | 5/2006 | Kim et al. |
| 2006/0113907 A1 | 6/2006 | Im et al. |
| 2006/0115585 A1 | 6/2006 | Bulovic et al. |
| 2006/0130766 A1 | 6/2006 | Kim et al. |
| 2006/0144325 A1 | 7/2006 | Jung et al. |
| 2006/0152641 A1 | 7/2006 | Brody |
| 2006/0164786 A1 | 7/2006 | Kobayashi et al. |
| 2006/0169211 A1 | 8/2006 | Kim et al. |
| 2006/0174829 A1 | 8/2006 | An et al. |
| 2006/0205101 A1 | 9/2006 | Lee et al. |
| 2006/0244696 A1 | 11/2006 | Jung et al. |
| 2006/0267294 A1 | 11/2006 | Busse et al. |

(56) References Cited

U.S. PATENT DOCUMENTS

| | | |
|---|---|---|
| 2006/0269671 A1 | 11/2006 | Kim et al. |
| 2006/0272572 A1 | 12/2006 | Uematsu et al. |
| 2006/0278522 A1 | 12/2006 | Kim et al. |
| 2006/0278945 A1 | 12/2006 | Sakurai |
| 2006/0280588 A1 | 12/2006 | Blonigan et al. |
| 2007/0009552 A1 | 1/2007 | Whitehead et al. |
| 2007/0009652 A1 | 1/2007 | Manz et al. |
| 2007/0017445 A1 | 1/2007 | Takehara et al. |
| 2007/0022955 A1 | 2/2007 | Bender et al. |
| 2007/0024185 A1 | 2/2007 | Kitamura et al. |
| 2007/0046185 A1 | 3/2007 | Kim |
| 2007/0046913 A1 | 3/2007 | Shibazaki |
| 2007/0054044 A1 | 3/2007 | Shimosaki et al. |
| 2007/0075955 A1 | 4/2007 | Jung et al. |
| 2007/0077358 A1 | 4/2007 | Jeong et al. |
| 2007/0137568 A1 | 6/2007 | Schreiber |
| 2007/0148337 A1 | 6/2007 | Nichols et al. |
| 2007/0148348 A1 | 6/2007 | Huh et al. |
| 2007/0157879 A1 | 7/2007 | Yotsuya |
| 2007/0158471 A1 | 7/2007 | Park et al. |
| 2007/0163497 A1 | 7/2007 | Grace et al. |
| 2007/0178708 A1 | 8/2007 | Ukigaya |
| 2007/0190235 A1 | 8/2007 | Yamazaki et al. |
| 2007/0195844 A1 | 8/2007 | Ma et al. |
| 2007/0231460 A1 | 10/2007 | Ukigaya |
| 2007/0235157 A1 | 10/2007 | Bunker et al. |
| 2007/0275497 A1 | 11/2007 | Kwack et al. |
| 2007/0297887 A1 | 12/2007 | Tanaka |
| 2008/0018236 A1 | 1/2008 | Arai et al. |
| 2008/0038935 A1 | 2/2008 | Baude et al. |
| 2008/0057183 A1 | 3/2008 | Spindler et al. |
| 2008/0100201 A1 | 5/2008 | Wei et al. |
| 2008/0100204 A1 | 5/2008 | Kim |
| 2008/0115729 A1 | 5/2008 | Oda et al. |
| 2008/0118743 A1 | 5/2008 | Lee et al. |
| 2008/0129194 A1 | 6/2008 | Abe et al. |
| 2008/0131587 A1 | 6/2008 | Boroson et al. |
| 2008/0145521 A1 | 6/2008 | Guo et al. |
| 2008/0174235 A1 | 7/2008 | Kim et al. |
| 2008/0202421 A1 | 8/2008 | Allen et al. |
| 2008/0216741 A1 | 9/2008 | Ling et al. |
| 2008/0238294 A1 | 10/2008 | Xu et al. |
| 2008/0251785 A1 | 10/2008 | Noh et al. |
| 2008/0286461 A1 | 11/2008 | Noguchi et al. |
| 2008/0290791 A1 | 11/2008 | Lee et al. |
| 2008/0298947 A1 | 12/2008 | Yeo et al. |
| 2008/0309718 A1 | 12/2008 | Oya et al. |
| 2009/0001882 A1 | 1/2009 | Park et al. |
| 2009/0014412 A1 | 1/2009 | Nozawa et al. |
| 2009/0017192 A1 | 1/2009 | Matsuura |
| 2009/0027767 A1 | 1/2009 | Souriau et al. |
| 2009/0124033 A1 | 5/2009 | Moriyama |
| 2009/0133629 A1 | 5/2009 | Kamikawa et al. |
| 2009/0153033 A1 | 6/2009 | Lee et al. |
| 2009/0165713 A1 | 7/2009 | Kim et al. |
| 2009/0169868 A1 | 7/2009 | Haglund, Jr. et al. |
| 2009/0170230 A1 | 7/2009 | Kidu et al. |
| 2009/0181163 A1 | 7/2009 | Uetake |
| 2009/0208754 A1 | 8/2009 | Chu et al. |
| 2009/0220691 A1 | 9/2009 | Kim |
| 2009/0229524 A1 | 9/2009 | Kim et al. |
| 2009/0232976 A1 | 9/2009 | Yoon et al. |
| 2009/0269881 A1 | 10/2009 | Furuta et al. |
| 2009/0277386 A1 | 11/2009 | Takagi et al. |
| 2009/0279173 A1 | 11/2009 | Chui et al. |
| 2009/0302750 A1 | 12/2009 | Jun et al. |
| 2009/0304906 A1 | 12/2009 | Suduo et al. |
| 2009/0304924 A1 | 12/2009 | Gadgil |
| 2009/0308317 A1 | 12/2009 | Sone et al. |
| 2009/0315456 A1 | 12/2009 | Furukawa et al. |
| 2010/0001301 A1 | 1/2010 | Karg et al. |
| 2010/0055810 A1 | 3/2010 | Sung et al. |
| 2010/0086672 A1 | 4/2010 | Von Drasek et al. |
| 2010/0089443 A1 | 4/2010 | Bloomstein et al. |
| 2010/0090594 A1 | 4/2010 | Choi et al. |
| 2010/0130020 A1 | 5/2010 | Kim et al. |
| 2010/0156279 A1 | 6/2010 | Tamura et al. |
| 2010/0165454 A1 | 7/2010 | Suetsugu et al. |
| 2010/0170439 A1 | 7/2010 | Negishi |
| 2010/0192856 A1 | 8/2010 | Sung et al. |
| 2010/0196607 A1 | 8/2010 | Carlson et al. |
| 2010/0248416 A1 | 9/2010 | Priddy et al. |
| 2010/0255198 A1 | 10/2010 | Cleary et al. |
| 2010/0271602 A1 | 10/2010 | Hanazaki |
| 2010/0275842 A1 | 11/2010 | Park et al. |
| 2010/0297348 A1 | 11/2010 | Lee et al. |
| 2010/0297349 A1 | 11/2010 | Lee et al. |
| 2010/0310768 A1 | 12/2010 | Lee et al. |
| 2010/0316801 A1 | 12/2010 | Lee et al. |
| 2010/0328197 A1 | 12/2010 | Lee et al. |
| 2010/0330265 A1 | 12/2010 | Lee et al. |
| 2010/0330712 A1 | 12/2010 | Lee et al. |
| 2011/0033619 A1 | 2/2011 | Lee et al. |
| 2011/0033621 A1 | 2/2011 | Lee et al. |
| 2011/0042659 A1 | 2/2011 | Kim et al. |
| 2011/0045617 A1 | 2/2011 | Kang et al. |
| 2011/0048320 A1 | 3/2011 | Choi et al. |
| 2011/0052791 A1 | 3/2011 | Jo et al. |
| 2011/0052795 A1 | 3/2011 | Choi et al. |
| 2011/0053296 A1 | 3/2011 | Lee et al. |
| 2011/0053300 A1 | 3/2011 | Ryu et al. |
| 2011/0068331 A1 | 3/2011 | Koh et al. |
| 2011/0123707 A1 | 5/2011 | Lee et al. |
| 2011/0139069 A1 | 6/2011 | Ahn et al. |
| 2011/0165327 A1 | 7/2011 | Park et al. |
| 2011/0168986 A1 | 7/2011 | Lee et al. |
| 2011/0220019 A1 | 9/2011 | Lee et al. |
| 2011/0220022 A1 | 9/2011 | Hong et al. |
| 2011/0241438 A1 | 10/2011 | Kim et al. |
| 2011/0262625 A1 | 10/2011 | Park et al. |
| 2011/0266944 A1 | 11/2011 | Song et al. |
| 2012/0006259 A1 | 1/2012 | Sung et al. |
| 2012/0009328 A1 | 1/2012 | Ryu et al. |
| 2012/0009332 A1 | 1/2012 | Kim et al. |
| 2012/0009706 A1 | 1/2012 | Choi et al. |
| 2012/0028390 A1 | 2/2012 | Lee et al. |
| 2012/0068199 A1 | 3/2012 | Sung et al. |
| 2012/0068201 A1 | 3/2012 | Sung et al. |
| 2012/0070928 A1 | 3/2012 | Kim et al. |
| 2012/0083061 A1 | 4/2012 | Kang et al. |
| 2012/0097992 A1 | 4/2012 | Jeong |
| 2012/0100282 A1 | 4/2012 | Lee et al. |
| 2012/0103253 A1 | 5/2012 | Park et al. |
| 2012/0132137 A1 | 5/2012 | Oh et al. |
| 2012/0145077 A1 | 6/2012 | Chang et al. |
| 2012/0148743 A1 | 6/2012 | Bulovic et al. |
| 2012/0174865 A1 | 7/2012 | Choi et al. |
| 2012/0175605 A1 | 7/2012 | Shin et al. |
| 2012/0183676 A1 | 7/2012 | Sonoda et al. |
| 2012/0214263 A1 | 8/2012 | Yamazaki et al. |
| 2012/0299016 A1 | 11/2012 | Choi |
| 2012/0299023 A1 | 11/2012 | Lee et al. |
| 2012/0299024 A1 | 11/2012 | Lee et al. |
| 2012/0301614 A1 | 11/2012 | Choi et al. |
| 2012/0301986 A1 | 11/2012 | Choi et al. |
| 2012/0313251 A1 | 12/2012 | Kato |
| 2013/0001528 A1 | 1/2013 | Chang et al. |
| 2013/0008379 A1 | 1/2013 | Chang et al. |
| 2013/0032829 A1 | 2/2013 | Sung et al. |
| 2013/0157016 A1 | 6/2013 | Kim |
| 2013/0217164 A1 | 8/2013 | Kang et al. |
| 2013/0291796 A1 | 11/2013 | Inoue et al. |
| 2013/0298829 A1 | 11/2013 | Jo et al. |
| 2013/0341598 A1 | 12/2013 | Chang et al. |
| 2014/0010957 A1 | 1/2014 | Inoue et al. |
| 2014/0014917 A1 | 1/2014 | Lee et al. |
| 2014/0014918 A1 | 1/2014 | Han |
| 2014/0014920 A1 | 1/2014 | Lee |
| 2014/0014921 A1 | 1/2014 | Choi |
| 2014/0014924 A1 | 1/2014 | Oh et al. |
| 2014/0014929 A1 | 1/2014 | Lee et al. |
| 2014/0034917 A1 | 2/2014 | Lee et al. |
| 2014/0045343 A1 | 2/2014 | Choi et al. |
| 2014/0077168 A1 | 3/2014 | Kim |

(56) References Cited

U.S. PATENT DOCUMENTS

| | | |
|---|---|---|
| 2014/0084262 A1 | 3/2014 | Kim |
| 2014/0084263 A1 | 3/2014 | Jin et al. |
| 2014/0110680 A1 | 4/2014 | Choe |
| 2014/0131667 A1 | 5/2014 | Chang |

FOREIGN PATENT DOCUMENTS

| | | | |
|---|---|---|---|
| CN | 1489419 A | 4/2004 | |
| CN | 1500904 A | 6/2004 | |
| CN | 1556872 A | 12/2004 | |
| CN | 1607868 A | 4/2005 | |
| CN | 1682569 A | 10/2005 | |
| CN | 1704501 A | 12/2005 | |
| CN | 1716102 A | 1/2006 | |
| CN | 1814854 A | 8/2006 | |
| CN | 1841696 A | 10/2006 | |
| EP | 1413644 A2 | 4/2004 | |
| EP | 1418250 A2 | 5/2004 | |
| EP | 1518940 A1 | 3/2005 | |
| EP | 2354270 A1 | 8/2011 | |
| IO | 10-2011-0110525 A | 10/2011 | |
| JP | 57-194252 A2 | 11/1982 | |
| JP | 2-247372 | 10/1990 | |
| JP | 4-272170 | 9/1992 | |
| JP | 5-22405 U1 | 3/1993 | |
| JP | 5-98425 A2 | 4/1993 | |
| JP | 5-230628 A2 | 9/1993 | |
| JP | 8-27568 A2 | 1/1996 | |
| JP | 9-95776 A2 | 4/1997 | |
| JP | 10-50478 | 2/1998 | |
| JP | 10-120171 | 5/1998 | |
| JP | 10-270535 | 10/1998 | |
| JP | 11-144865 | 5/1999 | |
| JP | 2000-68054 A2 | 3/2000 | |
| JP | 2000-282219 | 10/2000 | |
| JP | 2000-323277 | 11/2000 | |
| JP | 2001-28325 A2 | 1/2001 | |
| JP | 2001-52862 A2 | 2/2001 | |
| JP | 2001-093667 | 4/2001 | |
| JP | 2002-75638 A2 | 3/2002 | |
| JP | 2002-175878 | 6/2002 | |
| JP | 2002-348659 A2 | 12/2002 | |
| JP | 2003-3250 A2 | 1/2003 | |
| JP | 2003-77662 A2 | 3/2003 | |
| JP | 2003-157973 | 5/2003 | |
| JP | 2003-197531 A2 | 7/2003 | |
| JP | 2003-297562 | 10/2003 | |
| JP | 2003-321767 A2 | 11/2003 | |
| JP | 2003-347394 A2 | 12/2003 | |
| JP | 2004-035964 A2 | 2/2004 | |
| JP | 2004-043898 A2 | 2/2004 | |
| JP | 2004-76150 A2 | 3/2004 | |
| JP | 2004-91858 A2 | 3/2004 | |
| JP | 2004-103269 | 4/2004 | |
| JP | 2004-103341 | 4/2004 | |
| JP | 2004-107764 A2 | 4/2004 | |
| JP | 2004-137583 A2 | 5/2004 | |
| JP | 2004-143521 A2 | 5/2004 | |
| JP | EP 1418250 A2 * | 5/2004 | ........... C23C 14/243 |
| JP | 2004-169169 A2 | 6/2004 | |
| JP | 2004-199919 | 7/2004 | |
| JP | 2004-225058 | 8/2004 | |
| JP | 2004-342455 A2 | 12/2004 | |
| JP | 2004-349101 | 12/2004 | |
| JP | 2004-355975 | 12/2004 | |
| JP | 2005-44592 A2 | 2/2005 | |
| JP | 2005-101505 | 4/2005 | |
| JP | 2005-122980 A2 | 5/2005 | |
| JP | 2005-163099 | 6/2005 | |
| JP | 2005-165015 A2 | 6/2005 | |
| JP | 2005-174843 A2 | 6/2005 | |
| JP | 2005-206939 A2 | 8/2005 | |
| JP | 2005-213616 A2 | 8/2005 | |
| JP | 2005-235568 | 9/2005 | |
| JP | 2005-293968 | 10/2005 | |
| JP | 2005-296737 | 10/2005 | |
| JP | 2005293968 A * | 10/2005 | |
| JP | 2006-28583 A2 | 2/2006 | |
| JP | 2006-172930 A2 | 6/2006 | |
| JP | 2006-176809 A2 | 7/2006 | |
| JP | 2006-210038 A2 | 8/2006 | |
| JP | 2006-219760 | 8/2006 | |
| JP | 2006-275433 A2 | 10/2006 | |
| JP | 2006-292955 A2 | 10/2006 | |
| JP | 2006-307247 A2 | 11/2006 | |
| JP | 2007-47293 | 2/2007 | |
| JP | 2007-66862 | 3/2007 | |
| JP | 2007-146219 | 6/2007 | |
| JP | 2007-157886 | 6/2007 | |
| JP | 2007-186740 A2 | 7/2007 | |
| JP | 2007-242436 | 9/2007 | |
| JP | 2007-291506 A2 | 11/2007 | |
| JP | 2008-19477 A2 | 1/2008 | |
| JP | 2008-108628 A2 | 5/2008 | |
| JP | 2008-121098 | 5/2008 | |
| JP | 2008-521165 A2 | 6/2008 | |
| JP | 2008-156686 | 7/2008 | |
| JP | 2008-196003 | 8/2008 | |
| JP | 2008-248301 A2 | 10/2008 | |
| JP | 2008-274373 | 11/2008 | |
| JP | 2008-300056 | 12/2008 | |
| JP | 2009-019243 | 1/2009 | |
| JP | 2009-24208 A2 | 2/2009 | |
| JP | 2009-049223 | 3/2009 | |
| JP | 2009-81165 A2 | 4/2009 | |
| JP | 2009-087910 | 4/2009 | |
| JP | 2009-117231 A2 | 5/2009 | |
| JP | 2009-520110 | 5/2009 | |
| JP | 2010-159167 A2 | 7/2010 | |
| JP | 2010-261081 A2 | 11/2010 | |
| JP | 2011-47035 | 3/2011 | |
| JP | 2011-146377 | 7/2011 | |
| JP | 2012-92448 | 5/2012 | |
| JP | 2012-211352 | 11/2012 | |
| KR | 1997-0008709 A | 2/1997 | |
| KR | 10-0257219 B1 | 2/2000 | |
| KR | 10-2000-0019254 A | 4/2000 | |
| KR | 10-2000-0023929 A | 5/2000 | |
| KR | 2001-0024652 A | 3/2001 | |
| KR | 2001-0030175 A | 4/2001 | |
| KR | 10-2001-0039298 A | 5/2001 | |
| KR | 10-2001-0059939 | 7/2001 | |
| KR | 10-2001-0092914 A | 10/2001 | |
| KR | 2001-0093666 A | 10/2001 | |
| KR | 20-0257218 Y1 | 12/2001 | |
| KR | 10-2002-0000201 | 1/2002 | |
| KR | 2002-0001555 A | 1/2002 | |
| KR | 2002-0025760 | 4/2002 | |
| KR | 10-2002-0050922 | 6/2002 | |
| KR | 2002-0088662 A | 11/2002 | |
| KR | 10-2002-0090934 | 12/2002 | |
| KR | 10-2002-0091457 A | 12/2002 | |
| KR | 2003-0001745 A | 1/2003 | |
| KR | 2003-0034730 A | 5/2003 | |
| KR | 10-2003-0043012 A | 6/2003 | |
| KR | 2003-0046090 A | 6/2003 | |
| KR | 2003-0069684 A | 8/2003 | |
| KR | 10-0405080 B1 | 11/2003 | |
| KR | 10-0406059 B1 | 11/2003 | |
| KR | 2003-0091947 | 12/2003 | |
| KR | 2003-0093959 | 12/2003 | |
| KR | 2003-0094033 A | 12/2003 | |
| KR | 10-2004-0014258 A | 2/2004 | |
| KR | 20-0342433 Y1 | 2/2004 | |
| KR | 10-2004-0034537 A | 4/2004 | |
| KR | 10-2004-0039910 A | 5/2004 | |
| KR | 10-0430336 B1 | 5/2004 | |
| KR | 10-2004-0050045 A | 6/2004 | |
| KR | 10-2004-0069281 A | 8/2004 | |
| KR | 10-2004-0084747 | 10/2004 | |
| KR | 10-2004-0087142 A | 10/2004 | |
| KR | 10-2004-0110718 A | 12/2004 | |
| KR | 10-0463212 B1 | 12/2004 | |
| KR | 10-2005-0018234 A | 2/2005 | |

(56) References Cited

FOREIGN PATENT DOCUMENTS

| | | |
|---|---|---|
| KR | 10-2005-0024324 A | 3/2005 |
| KR | 10-2005-0028943 | 3/2005 |
| KR | 10-2005-0039140 A | 4/2005 |
| KR | 10-0483487 B1 | 4/2005 |
| KR | 10-2005-0062853 A | 6/2005 |
| KR | 10-2005-0082644 A | 8/2005 |
| KR | 10-0520159 B1 | 10/2005 |
| KR | 10-0532657 B1 | 12/2005 |
| KR | 10-2006-0008602 A | 1/2006 |
| KR | 10-2006-0018745 A | 3/2006 |
| KR | 10-2006-0020050 A | 3/2006 |
| KR | 10-2006-0045225 A | 5/2006 |
| KR | 10-2006-0049050 A | 5/2006 |
| KR | 10-2006-0051746 A | 5/2006 |
| KR | 10-2006-0053926 A | 5/2006 |
| KR | 10-2006-0056706 A | 5/2006 |
| KR | 10-2006-0058459 A | 5/2006 |
| KR | 10-2006-0059068 A | 6/2006 |
| KR | 10-2006-0059323 A | 6/2006 |
| KR | 10-2006-0060994 | 6/2006 |
| KR | 10-2006-0065978 A | 6/2006 |
| KR | 10-2006-0073367 A | 6/2006 |
| KR | 10-2006-0077887 A | 7/2006 |
| KR | 10-2006-0080475 A | 7/2006 |
| KR | 10-2006-0080481 A | 7/2006 |
| KR | 10-2006-0080482 A | 7/2006 |
| KR | 10-2006-0081943 A | 7/2006 |
| KR | 10-2006-0083510 A | 7/2006 |
| KR | 10-2006-0092387 A | 8/2006 |
| KR | 10-2006-0098755 A | 9/2006 |
| KR | 10-2006-0104288 A | 10/2006 |
| KR | 10-2006-0104675 A | 10/2006 |
| KR | 10-2006-0104677 A | 10/2006 |
| KR | 10-2006-0109561 A | 10/2006 |
| KR | 10-2006-0109627 A | 10/2006 |
| KR | 10-0635903 B1 | 10/2006 |
| KR | 10-2006-0114462 A | 11/2006 |
| KR | 10-2006-0114477 A | 11/2006 |
| KR | 10-2006-0114573 A | 11/2006 |
| KR | 10-0645719 B1 | 11/2006 |
| KR | 10-0646160 B1 | 11/2006 |
| KR | 10-2006-0123944 A | 12/2006 |
| KR | 10-0687007 B1 | 2/2007 |
| KR | 10-0696547 B1 | 3/2007 |
| KR | 10-0696550 B1 | 3/2007 |
| KR | 10-0697663 B1 | 3/2007 |
| KR | 10-0698033 B1 | 3/2007 |
| KR | 10-0700466 B1 | 3/2007 |
| KR | 10-2007-0035796 A | 4/2007 |
| KR | 10-2007-0037848 A | 4/2007 |
| KR | 10-0711885 B1 | 4/2007 |
| KR | 10-2007-0050793 A | 5/2007 |
| KR | 10-0723627 B1 | 5/2007 |
| KR | 10-2007-0056190 A | 6/2007 |
| KR | 10-0726132 B1 | 6/2007 |
| KR | 10-0736218 B1 | 7/2007 |
| KR | 10-0739309 B1 | 7/2007 |
| KR | 10-0741142 B1 | 7/2007 |
| KR | 10-2007-0078713 A | 8/2007 |
| KR | 10-2007-0080635 A | 8/2007 |
| KR | 10-2007-0091437 A | 9/2007 |
| KR | 10-2006-0028115 | 10/2007 |
| KR | 10-2007-0097218 | 10/2007 |
| KR | 10-2007-0098122 A | 10/2007 |
| KR | 10-2007-0101842 A | 10/2007 |
| KR | 10-2007-0105595 A | 10/2007 |
| KR | 10-0768212 B1 | 10/2007 |
| KR | 10-0770653 B1 | 10/2007 |
| KR | 10-2007-0112668 A | 11/2007 |
| KR | 10-2007-0114094 A | 11/2007 |
| KR | 10-0787457 B1 | 12/2007 |
| KR | 10-2008-0001184 A | 1/2008 |
| KR | 10-2008-0003720 A | 1/2008 |
| KR | 10-2008-0007896 A | 1/2008 |
| KR | 10-2008-0009285 A | 1/2008 |
| KR | 10-0797787 B1 | 1/2008 |
| KR | 10-0800125 B1 | 1/2008 |
| KR | 10-0815265 B1 | 3/2008 |
| KR | 10-2008-0036983 A | 4/2008 |
| KR | 10-0823508 B1 | 4/2008 |
| KR | 10-0823511 B1 | 4/2008 |
| KR | 10-2008-0044239 A | 5/2008 |
| KR | 10-2008-0044775 A | 5/2008 |
| KR | 10-2008-0046761 A | 5/2008 |
| KR | 10-0827760 B1 | 5/2008 |
| KR | 10-2008-0048653 | 6/2008 |
| KR | 10-2008-0055124 A | 6/2008 |
| KR | 10-2008-0057159 A | 6/2008 |
| KR | 10-0839380 B1 | 6/2008 |
| KR | 10-2008-0060400 A | 7/2008 |
| KR | 10-2008-0061132 A | 7/2008 |
| KR | 10-2008-0061666 A | 7/2008 |
| KR | 10-2008-0061774 A | 7/2008 |
| KR | 10-2008-0062212 A | 7/2008 |
| KR | 10-2008-0076574 A | 8/2008 |
| KR | 10-2008-0088737 A | 10/2008 |
| KR | 10-2008-0104479 A | 12/2008 |
| KR | 10-2008-0104695 A | 12/2008 |
| KR | 10-2008-0109559 A | 12/2008 |
| KR | 10-2009-0017910 A | 2/2009 |
| KR | 10-0889872 B1 | 3/2009 |
| KR | 10-2009-0038733 A | 4/2009 |
| KR | 10-2009-0040618 A | 4/2009 |
| KR | 10-2009-0047953 A | 5/2009 |
| KR | 10-2009-0052155 A | 5/2009 |
| KR | 10-2009-0052828 A | 5/2009 |
| KR | 10-2009-0053417 A | 5/2009 |
| KR | 10-0899279 B1 | 5/2009 |
| KR | 10-2009-0066996 A | 6/2009 |
| KR | 10-2009-0075887 A | 7/2009 |
| KR | 10-2009-0079765 A | 7/2009 |
| KR | 10-2009-0081717 A | 7/2009 |
| KR | 10-0908232 B1 | 7/2009 |
| KR | 10-2009-0093161 A | 9/2009 |
| KR | 10-2009-0094911 A | 9/2009 |
| KR | 10-2009-0097453 A | 9/2009 |
| KR | 10-2009-0107702 | 10/2009 |
| KR | 10-0922763 A | 10/2009 |
| KR | 10-2010-0000128 A | 1/2010 |
| KR | 10-2010-0000129 A | 1/2010 |
| KR | 10-2010-0002381 A | 1/2010 |
| KR | 10-2010-0026655 A | 3/2010 |
| KR | 10-2010-0038088 A | 4/2010 |
| KR | 10-2010-0044606 A | 4/2010 |
| KR | 10-2010-0047796 | 5/2010 |
| KR | 10-0961110 B1 | 6/2010 |
| KR | 10-2010-0090070 A | 8/2010 |
| KR | 10-2010-0099806 A | 9/2010 |
| KR | 10-2010-0119368 A | 11/2010 |
| KR | 10-2010-0126125 A | 12/2010 |
| KR | 10-2010-0128589 A | 12/2010 |
| KR | 10-2010-0130786 A | 12/2010 |
| KR | 10-2010-0133678 A | 12/2010 |
| KR | 10-2010-0138139 A | 12/2010 |
| KR | 10-1017654 B1 | 2/2011 |
| KR | 10-2011-0021090 A | 3/2011 |
| KR | 10-2011-0022512 A | 3/2011 |
| KR | 10-2011-0032589 A | 3/2011 |
| KR | 10-2011-0082418 A | 7/2011 |
| KR | 10-2011-0101767 A | 9/2011 |
| KR | 10-2011-0120213 A | 11/2011 |
| KR | 10-2011-0138787 A | 12/2011 |
| KR | 10-2012-0006322 A | 1/2012 |
| KR | 10-2012-0006324 A | 1/2012 |
| KR | 10-2012-0012300 | 2/2012 |
| KR | 10-2012-0042155 A | 5/2012 |
| KR | 10-2012-0065789 A | 6/2012 |
| KR | 10-2012-0080855 A | 7/2012 |
| KR | 10-2012-0081811 A | 7/2012 |
| KR | 10-1193186 B1 | 10/2012 |
| KR | 10-2012-0131545 A | 12/2012 |
| KR | 10-2013-0007308 A | 1/2013 |
| WO | 9925894 A1 | 5/1999 |

(56) References Cited

FOREIGN PATENT DOCUMENTS

| WO | 03043067 A1 | 5/2003 |
|---|---|---|
| WO | WO2004016406 A1 | 2/2004 |
| WO | 2008004792 A1 | 1/2008 |

OTHER PUBLICATIONS

European Search Report dated May 13, 2011 for European Application No. 11250019.4 (6 pages).
European Search Report dated May 20, 2011 for European Application No. 10251404.9 (12 pages).
European Search Report dated May 27, 2011 for European Application No. 10251514.5 (11 pages).
European Search Report dated Sep. 6, 2010 for European Application No. 10250962.7 (5 pages).
Japanese Patent Office Action dated Jan. 22, 2013 for Japanese Application No. 2010-116470, (3 pages).
Japanese Patent Office Action dated Jan. 8, 2013 for Japanese Application No. 2011-000180 (3 pages).
Japanese Patent Office Action dated Mar. 19, 2013 for Japanese Application No. 2011-097909, (3 pages).
JP Office action dated Aug. 21, 2012, issued to JP Application No. 2010-145075 (5 pages).
JP Office action dated Sep. 4, 2012, issued to JP Application No. 2010-152846 (4 pages).
JPO Office action dated Apr. 1, 2014, for Japanese Patent application 2010-286245 (4 pages).
JPO Office action dated Feb. 25, 2014, for corresponding Japanese Patent application 2013-128405 (3 pages).
JPO Office action dated Jan. 20, 2015 for corresponding Japanese Patent application 2011-118686 (5 pages).
JPO Office action dated Jan. 28, 2014, for corresponding Japanese Patent application 2011-097909 (4 pages).
KIPO Notice of Allowance dated Apr. 26, 2012 for Korean Application No. 10-2010-0066991 (5 pages).
KIPO Notice of Allowance dated Apr. 30, 2012, issued to KR 10-2010-0066992 (5 pages).
KIPO Notice of Allowance dated Aug. 24, 2012, issued to KR 10-2010-0066993 (5 pages).
KIPO Notice of Allowance dated Jul. 20, 2012, issued to KR 10-2010-0003545 (5 pages).
KIPO Notice of Allowance dated Oct. 27, 2011 for Korean Application No. 10-2010-0002381 (5 pages).
KIPO Notice of Allowance dated Oct. 31, 2011, for Korean Patent application 10-2010-0014273, ( 5 pages).
KIPO Notice of Allowance dated Sep. 1, 2012, for Korean Patent application 10-2010-0013847 (5 pages).
KIPO Notice of Allowance dated Sep. 1, 2012, issued to KR 10-2010-0009160 (5 pages).
KIPO Notice of Allowance dated Sep. 1, 2012, issued to KR 10-2010-0013848 (5 pages).
KIPO Notice of Allowance dated Sep. 23, 2011 for Korean Application No. 10-2009-0055473 (5 pages).
KIPO Notice of Allowance dated Sep. 28, 2011 for Korean Application No. 10-2009-0045201 (5 pages).
KIPO Notice of Allowance dated Sep. 28, 2011 for Korean Application No. 10-2009-0052359 (5 pages).
KIPO Notice of Allowance, dated Nov. 25, 2011, issued to KR 10-2010-0014277 (5 pages).
KIPO Notice of Allowance, dated Sep. 1, 2012, issued to KR 10-2010-0014276 (5 pages).
KIPO Notice of Allowance, dated Sep. 28, 2011, issued to KR 10-2009-0052357 (5 pages).
KIPO Office action dated Apr. 2, 2012, issued to KR 10-2010-0066993 (4 pages).
KIPO Office action dated Apr. 4, 2012, issued in KR Application No. 10-2009-0112796 (5 pages).
KIPO Office Action dated Apr. 9, 2012 for Korean Application No. 10-2010-0031556 (4 pages).
KIPO Office action dated Aug. 1, 2011, issued to KR 10-2009-0074001 (3 pages).
KIPO Office Action dated Aug. 28, 2012, issued to KR 10-2010-0014274 (5 pages).
KIPO Office action dated Feb. 1, 2012, for Korean Patent application 10-2010-0013847 (5 pages).
KIPO Office action dated Feb. 1, 2012, issued to KR 10-2010-0011196 (4 pages).
KIPO Office action dated Feb. 1, 2012, issued to KR 10-2010-0013848 (4 pages).
KIPO Office action dated Feb. 1, 2012, issued to KR 10-2010-0014272 (4 pages).
KIPO Office Action dated Feb. 6, 2012 for Korean Application No. 10-2010-0011480 (8 pages).
KIPO Office Action dated Feb. 6, 2012 for Korean Application No. 10-2010-0011481 (7 pages).
KIPO Office Action dated Feb. 6, 2012, issued to KR 10-2010-0014274 (9 pages).
KIPO Office Action dated Feb. 6, 2012, issued to KR 10-2010-0021835 (4 pages).
KIPO Office action dated Jan. 13, 2012, issued to KR 10-2009-0056529 (5 pages).
KIPO Office action dated Jan. 6, 2012, issued to KR Application No. 10-2010-0000897 (4 pages).
KIPO Office action dated Jul. 1, 2011, issued to KR Application No. 10-2009-0072111 (4 pages).
KIPO Office action dated Jun. 1, 2011, issued to KR Application No. 10-2009-0050528 (4 pages).
KIPO Office action dated Mar. 21, 2012, issued to KR Application No. 10-2010-0065465 (5 pages).
KIPO Office action dated Sep. 1, 2012, issued to KR 10-2010-0010136 (5 pages).
KIPO Registration Determination Certificate dated Jul. 2, 2012, for Korean Application No. 10-2010-0011480 (5 pages).
KIPO Registration Determination Certificate dated Jul. 2, 2012, for Korean Application No. 10-2010-0011481 (5 pages).
KIPO Registration Determination Certificate dated Nov. 30, 2011, for Korean application 10-2009-0056530 (5 pages).
KIPO Registration Determination Certificate, dated Jul. 20, 2012, issued to KR Application No. 10-2010-0000897 (5 pages).
Korean Registration Certificate dated Sep. 28, 2011 for Korean Application No. 10-2009-0045200 (5 pages).
SIPO Certificate of Patent dated Aug. 14, 2013, for Chinese application 201010266406.6, (36 pages).
SIPO Certificate of Patent dated Jul. 31, 2013, corresponding to Chinese Patent application 201110029291.3, (31 pages).
SIPO Office action dated Apr. 3, 2015, corresponding to Chinese Patent application 201210008397.X, (7 pages).
SIPO Office action dated Dec. 17, 2013, for Chinese Patent application 201010216896.9 (6 pages).
SIPO Office action dated Feb. 14, 2014, for corresponding Chinese Patent application 201010189614.0 (16 pages).
SIPO Office action dated Feb. 2, 2015, for corresponding Chinese Patent application 201110199594.X (12 pages).
SIPO Office action dated Mar. 11, 2014, for corresponding Chinese Patent application 201010189581.X (9 pages).
SIPO Office Action dated May 29, 2013, for Chinese Application No. 201010189614.0 (12 pages).
SIPO Office Action dated Nov. 28, 2012 for Chinese Application No. 201110029291.3 (11 pages).
SIPO Office Action dated Oct. 9, 2012 for Chinese Application No. 201010266406.6 (6 pages).
Taiwanese Office action dated Apr. 14, 2014, for Taiwanese Patent application 100114360 (20 pages).
Taiwanese Office action dated Dec. 20, 2013, for Taiwanese Patent application 099116077 (8 pages).
U.S. Interview Summary dated Mar. 11, 2014 for U.S. Appl. No. 12/813,786 (4 pages).
U.S. Notice of Allowance dated Feb. 20, 2014, issued to U.S. Appl. No. 12/907,396 (13 pages).
U.S. Notice of Allowance dated Feb. 28, 2014, issued to U.S. Appl. No. 13/279,077 (12 pages).

(56) References Cited

OTHER PUBLICATIONS

U.S. Notice of Allowance dated Jun. 11, 2014, issued to U.S. Appl. No. 13/468,835 (62 pages).
U.S. Notice of Allowance dated Jun. 30, 2014, issued to U.S. Appl. No. 12/907,396 (40 pages).
U.S. Notice of Allowance dated May 9, 2014 for U.S. Appl. No. 13/194,759 (27 pages).
U.S. Notice of Allowance dated Oct. 28, 2014, issued to U.S. Appl. No. 13/014,225 (64 pages).
U.S. Office action dated Apr. 1, 2013, issued to U.S. Appl. No. 12/784,774 (44 pages).
U.S. Office action dated Apr. 18, 2014, issued to U.S. Appl. No. 12/814,816 (9 pages).
U.S. Office action dated Apr. 29, 2013, issued to U.S. Appl. No. 12/820,355 (31 pages).
U.S. Office action dated Aug. 13, 2013, issued to U.S. Appl. No. 13/194,759, (28 pages).
U.S. Office Action dated Aug. 2, 2013 for U.S. Appl. No. 12/868,099 (32 pages).
U.S. Office action dated Aug. 21, 2013 issued in cross-reference U.S. Appl. No. 12/820,355 (14 pages).
U.S. Office action dated Aug. 7, 2013, issued to U.S. Appl. No. 13/015,357, (30 pages).
U.S. Office action dated Aug. 8, 2013, for cross reference U.S. Appl. No. 13/093,707, (7 pages).
U.S. Office Action dated Dec. 13, 2011 for U.S. Appl. No. 12/849,193 (30 pages).
U.S. Office action dated Dec. 13, 2013, issued to U.S. Appl. No. 13/180,454 (18 pages).
U.S. Office action dated Dec. 16, 2013 for U.S. Appl. No. 14/054,536 (35 pages).
U.S. Office action dated Dec. 17, 2012, issued to U.S. Appl. No. 12/873,556 (37 pages).
U.S. Office action dated Dec. 2, 2013, issued to U.S. Appl. No. 13/157,220 (33 pages).
U.S. Office action dated Dec. 26, 2012, issued to U.S. Appl. No. 12/815,673 (21 pages).
U.S. Office action dated Dec. 31, 2014 issued to U.S. Appl. No. 12/873,556, (72 pages).
U.S. Office action dated Dec. 31, 2014 issued to U.S. Appl. No. 13/469,029 (74 pages).
U.S. Office action dated Feb. 11, 2014, for cross reference U.S. Appl. No. 13/178,472 (8 pages).
U.S. Office action dated Feb. 26, 2013, issued to U.S. Appl. No. 12/794,093 (31 pages).
U.S. Office action dated Feb. 6, 2014, for U.S. Appl. No. 12/984,231 (16 pages).
U.S. Office action dated Jan. 25, 2013, issued to U.S. Appl. No. 13/015,357 (21 pages).
U.S. Office action dated Jul. 11, 2013 for U.S. Appl. No. 13/461,669 (27 pages).
U.S. Office action dated Jul. 17, 2013, issued to U.S. Appl. No. 12/984,231, (18 pages).
U.S. Office action dated Jul. 24, 2013, issued to U.S. Appl. No. 12/784,804, (52 pages).
U.S. Office action dated Jul. 3, 2013 in U.S. Appl. No. 12/873,689 (48 pages).
U.S. Office action dated Jul. 5, 2013, issued to U.S. Appl. No. 12/873,556, (17 pages).
U.S. Office Action dated Jun. 11, 2013 for U.S. Appl. No. 12/979,656 (50 pages).
U.S. Office action dated Jun. 11, 2013, issued to U.S. Appl. No. 12/862,125 (37 pages).
U.S. Office action dated Jun. 17, 2013, for cross reference U.S. Appl. No. 13/180,454, (23 pages).
U.S. Office action dated Jun. 17, 2014, issued to U.S. Appl. No. 13/157,220 (36 pages).
U.S. Office Action dated Jun. 21, 2011 for U.S. Appl. No. 12/862,153 (21 pages).
U.S. Office action dated Jun. 26, 2013, issued to U.S. Appl. No. 12/794,093 (20 pages).
U.S. Office action dated Mar. 15, 2013, issued to U.S. Appl. No. 12/813,786 (33 pages).
U.S. Office action dated Mar. 17, 2014, for U.S. Appl. No. 12/950,361 (48 pages).
U.S. Office action dated Mar. 18, 2013, issued to U.S. Appl. No. 12/984,231 (29 pages).
U.S. Office action dated Mar. 19, 2013, issued to U.S. Appl. No. 13/194,759 (36 pages).
U.S. Office action dated Mar. 22, 2013, issued to U.S. Appl. No. 12/987,569 (12 pages).
U.S. Office Action dated Mar. 23, 2012 for U.S. Appl. No. 12/849,193 (17 pages).
U.S. Office action dated May 21, 2014, issued to U.S. Appl. No. 13/014,225 (15 pages).
U.S. Office action dated May 22, 2013, for cross reference U.S. Appl. No. 13/219,427, (26 pages).
U.S. Office action dated May 24, 2013, for U.S. Appl. No. 13/279,077 (20 pages).
U.S. Office action dated May 24, 2013, issued to U.S. Appl. No. 12/849,092 (31 pages).
U.S. Office action dated May 6, 2014, issued to U.S. Appl. No. 13/467,998 (21 pages).
U.S. Office Action dated May 7, 2013, issued in U.S. Appl. No. 12/820,270 (37 pages).
U.S. Office action dated Nov. 14, 2014, issued to U.S. Appl. No. 13/178,472 (10 pages).
U.S. Office action dated Nov. 20, 2013, for cross reference U.S. Appl. No. 12/868,099, (14 pages).
U.S. Office action dated Nov. 22, 2013, issued to U.S. Appl. No. 13/198,591, (28 pages).
U.S. Office action dated Nov. 25, 2013, issued to U.S. Appl. No. 13/176,701, (49 pages).
U.S. Office action dated Nov. 4, 2013, for U.S. Appl. No. 13/219,427, (26 pages).
U.S. Office action dated Oct. 1, 2013, issued to U.S. Appl. No. 12/849,092, (13 pages).
U.S. Office action dated Oct. 11, 2013, issued to U.S. Appl. No. 12/907,396, (44 pages).
U.S. Office action dated Oct. 21, 2013, issued to U.S. Appl. No. 12/987,569, (14 pages).
U.S. Office Action dated Oct. 3, 2012 for U.S. Appl. No. 12/869,830 (28 pages).
U.S. Office action dated Oct. 7, 2013, issued to U.S. Appl. No. 13/279,077, (29 pages).
U.S. Office action dated Sep. 20, 2013, issued to U.S. Appl. No. 13/014,225, (33 pages).
U.S. Office action dated Sep. 25, 2013, for U.S. Appl. No. 13/031,756, (34 pages).
U.S. Office action dated Sep. 26, 2014, issued to U.S. Appl. No. 12/868,099 (66 pages).
U.S. Office action dated Sep. 27, 2013, issued to U.S. Appl. No. 12/814,816 (19 pages).
U.S. Patent Office Action dated May 16, 2013, issued to U.S. Appl. No. 13/235,337 (28 pages).
US Notice of Allowance, dated Mar. 18, 2013, issued to U.S. Appl. No. 12/795,001 (29 pages).
US Office action dated Dec. 20, 2012, issued to U.S. Appl. No. 12/984,289 (20pages).
US Office action dated Sep. 12, 2012, in U.S. Appl. No. 12/815,673 (26 pages).
Taiwan Office action dated Dec. 15, 2015, for corresponding Taiwanese Patent application 101101052, (13 pages).
SIPO Granted Document dated Sep. 21, 2016, corresponding to Chinese Patent Application No. 201310381944.3 (33 pages).
U.S. Office Action dated May 24, 2016 for U.S. Appl. No. 12/979,656 (27 sheets).
U.S. Office Action dated Oct. 6, 2016 for U.S. Appl. No. 15/145,689 (27 sheets).

\* cited by examiner

US 9,748,483 B2

DEPOSITION SOURCE AND ORGANIC LAYER DEPOSITION APPARATUS INCLUDING THE SAME

CROSS-REFERENCE TO RELATED APPLICATION

This application is a continuation of U.S. patent application Ser. No. 13/328,524, filed on Dec. 16, 2011, which claims the benefit of Korean Patent Application No. 10-2011-0003155, filed on Jan. 12, 2011 in the Korean Intellectual Property Office, the disclosure of each of which are incorporated herein in their entirety by reference.

BACKGROUND

1. Field

Aspects of embodiments of the present invention relate to a deposition source and an organic layer deposition apparatus, and more particularly, to a deposition source and an organic layer deposition apparatus that can be simply applied to produce large-sized display apparatuses on a mass scale and that can prevent or substantially prevent deposition source nozzles from being blocked during a deposition process.

2. Description of the Related Art

Organic light-emitting display apparatuses have a larger viewing angle, better contrast characteristics, and a faster response rate than other display apparatuses, and thus have drawn attention as next-generation display apparatuses.

Organic light-emitting display apparatuses generally have a stacked structure including an anode, a cathode, and an emission layer interposed between the anode and the cathode. The apparatuses display images in color when holes and electrons, injected respectively from the anode and the cathode, recombine in the emission layer and thus light is emitted.

It is difficult to achieve high light-emission efficiency with such a structure, and thus intermediate layers, including an electron injection layer, an electron transport layer, a hole transport layer, a hole injection layer, or the like, are optionally additionally interposed between the emission layer and each of the electrodes.

Also, it is practically very difficult to form fine patterns in organic thin films such as the emission layer and the intermediate layers, and red, green, and blue light-emission efficiency varies according to the organic thin films. For these reasons, it is not easy to form an organic thin film pattern on a large substrate, such as a mother glass having a size of 5 G or more, by using a conventional organic layer deposition apparatus, and thus it is difficult to manufacture large organic light-emitting display apparatuses having satisfactory driving voltage, current density, brightness, color purity, light-emission efficiency, and life-span characteristics. Thus, there is a demand for improvement in this regard.

SUMMARY

According to aspects of embodiments of the present invention, a deposition source and an organic layer deposition apparatus may be easily manufactured, may be simply applied to manufacture large-sized display apparatuses on a mass scale, and may prevent or substantially prevent deposition source nozzles from being blocked during a deposition process.

According to an embodiment of the present invention, a deposition source includes a first deposition source and a second deposition source arranged along a first direction; a first deposition source nozzle unit at a side of the first deposition source and including a plurality of first deposition source nozzles arranged in the first direction; a second deposition source nozzle unit at a side of the second deposition source and comprising a plurality of second deposition source nozzles arranged in the first direction; a pair of first protruding reflectors arranged at opposite sides of the plurality of first deposition source nozzles, wherein the plurality of first deposition source nozzles are between the first protruding reflectors; and a pair of second protruding reflectors arranged at opposite sides of the plurality of second deposition source nozzles, wherein the plurality of second deposition source nozzles are between the second protruding reflectors, wherein the plurality of first deposition source nozzles and the plurality of second deposition source nozzles are tilted toward each other.

A host material may be discharged from the first deposition source and a dopant material may be discharged from the second deposition source.

The deposition source may further include a third protruding reflector connecting one end of one of the first protruding reflectors and one end of the other of the first protruding reflectors.

The one end of the one of the first protruding reflectors and the one end of the other of the first protruding reflectors may be adjacent to the second deposition source.

The deposition source may further include a fourth protruding reflector connecting one end of one of the second protruding reflectors and one end of the other of the second protruding reflectors.

The one end of the one of the second protruding reflectors and the one end of the other of the second protruding reflectors may be adjacent to the first deposition source.

Heights of the first protruding reflectors may be greater than or equal to heights of the first deposition source nozzles.

Heights of the second protruding reflectors may be greater than or equal to heights of the second deposition source nozzles.

In one embodiment, a deposition source nozzle closest to the second deposition source from among the plurality of first deposition source nozzles is a dummy nozzle and does not have an aperture therein, such that a deposition material contained in the first deposition source is not dischargeable through the dummy nozzle.

In one embodiment, a deposition source nozzle closest to the first deposition source from among the plurality of second deposition source nozzles is a dummy nozzle and does not have an aperture therein, such that a deposition material contained in the second deposition source is not dischargeable through the dummy nozzle.

According to another embodiment of the present invention, an organic layer deposition apparatus for forming a thin film on a substrate includes a deposition source for discharging a deposition material; a deposition source nozzle unit at a side of the deposition source and including a plurality of deposition source nozzles arranged in a first direction; and a patterning slit sheet opposite the deposition source nozzle unit and having a plurality of patterning slits arranged in a second direction perpendicular to the first direction. The substrate is movable relative to the organic layer deposition apparatus in the first direction for performing deposition. The deposition source includes a first deposition source and a second deposition source for discharging different materials. The deposition source nozzle unit includes a first deposition source nozzle unit at a side of the first deposition source and including a plurality of first deposition source nozzles arranged in the first direction; and a second deposition source nozzle unit at a side of the second deposition source and including a plurality of second deposition source nozzles arranged in the first direction. The plurality of first deposition source nozzles and the plurality of second deposition source nozzles are tilted at a predetermined angle.

A host material may be discharged from the first deposition source, and a dopant material may be discharged from the second deposition source.

The first and second deposition sources may be arranged along the first direction.

The first deposition source nozzle unit may further include a first protruding reflector and a second protruding reflector arranged at opposite sides of the plurality of first deposition source nozzles, wherein the plurality of first deposition source nozzles are between the first and second protruding reflectors.

The organic layer deposition apparatus may further include a third protruding reflector connecting one end of the first protruding reflector and one end of the second protruding reflector.

The one end of the first protruding reflector and the one end of the second protruding reflector may be adjacent to the second deposition source.

Heights of the first and second protruding reflectors may be greater than or equal to heights of the first deposition source nozzles.

In one embodiment, a deposition source nozzle closest to the second deposition source from among the plurality of first deposition source nozzles is a dummy nozzle and does not include an aperture therein, such that a deposition material contained in the first deposition source is not dischargeable through the dummy nozzle.

The second deposition source nozzle unit may further include a fourth protruding reflector and a fifth protruding reflector arranged at opposite sides of the plurality of second deposition source nozzles, wherein the plurality of second deposition source nozzles are between the fourth and fifth protruding reflectors.

The organic layer deposition apparatus may further include a sixth protruding reflector connecting one end of the fourth protruding reflector and one end of the fifth protruding reflector.

The one end of the fourth protruding reflector and the one end of the fifth protruding reflector may be adjacent to the first deposition source.

Heights of the fourth and fifth protruding reflectors may be greater than or equal to heights of the second deposition source nozzles.

In one embodiment, a deposition source nozzle closest to the first deposition source from among the plurality of second deposition source nozzles is a dummy nozzle and does not include an aperture therein, such that a deposition material contained in the second deposition source is not dischargeable through the dummy nozzle.

The deposition source, the deposition source nozzle unit, and the patterning slit sheet may be formed as one body, such as by being connected to each other via connection members.

The apparatus may further include at least one connection member connected between the deposition source nozzle unit and the patterning slit sheet, the at least one connection member being configured to guide movement of the deposition material.

The at least one connection member may be formed to seal a space between the deposition source, the deposition source nozzle unit, and the patterning slit sheet.

The organic layer deposition apparatus may be spaced apart from the substrate by a distance.

The deposition material may be continuously deposited on the substrate while the substrate is moved relative to the organic layer deposition apparatus in the first direction.

The patterning slit sheet may be smaller than the substrate.

At least one portion of a host material discharged from the first deposition source may be mixed with at least one portion of a dopant material discharged from the second deposition source.

The first and second deposition sources may be arranged in the first direction to be parallel with each other.

The plurality of first deposition source nozzles and the plurality of second deposition source nozzles may be tilted to face each other.

The plurality of first deposition source nozzles and the plurality of second deposition source nozzles may be tilted in such a manner that a mixture ratio of a host material discharged from the first deposition source and a dopant material discharged from the second deposition source is maintained constant throughout the entire substrate.

The first and second deposition sources may be linear deposition sources.

Lower end portions of deposition source nozzles of at least one of the plurality of first deposition source nozzles or the plurality of second deposition source nozzles may have a curved surface.

BRIEF DESCRIPTION OF THE DRAWINGS

The above and other features of the present invention will become more apparent by describing in detail some exemplary embodiments thereof with reference to the attached drawings in which.

DETAILED DESCRIPTION

Some exemplary embodiments of the present invention will be described more fully hereinafter with reference to the accompanying drawings; however, embodiments of the present invention may be embodied in different forms and should not be construed as limited to the exemplary embodiments illustrated and set forth herein. Rather, these exemplary embodiments are provided by way of example for understanding of the invention and to convey the scope of the invention to those skilled in the art. As those skilled in the art would realize, the described embodiments may be modified in various ways, all without departing from the spirit or scope of the present invention.

An organic light-emitting display apparatus includes intermediate layers, including an emission layer disposed between a first electrode and a second electrode that are arranged opposite to each other. The electrodes and the intermediate layers may be formed by using various methods, one of which is a deposition method. When an organic light-emitting display apparatus is manufactured by using the deposition method, a fine metal mask (FMM) having the same pattern as a thin film to be formed is disposed to closely contact a substrate, and a thin film material is deposited over the FMM in order to form the thin film having the desired pattern.

Figure 1:
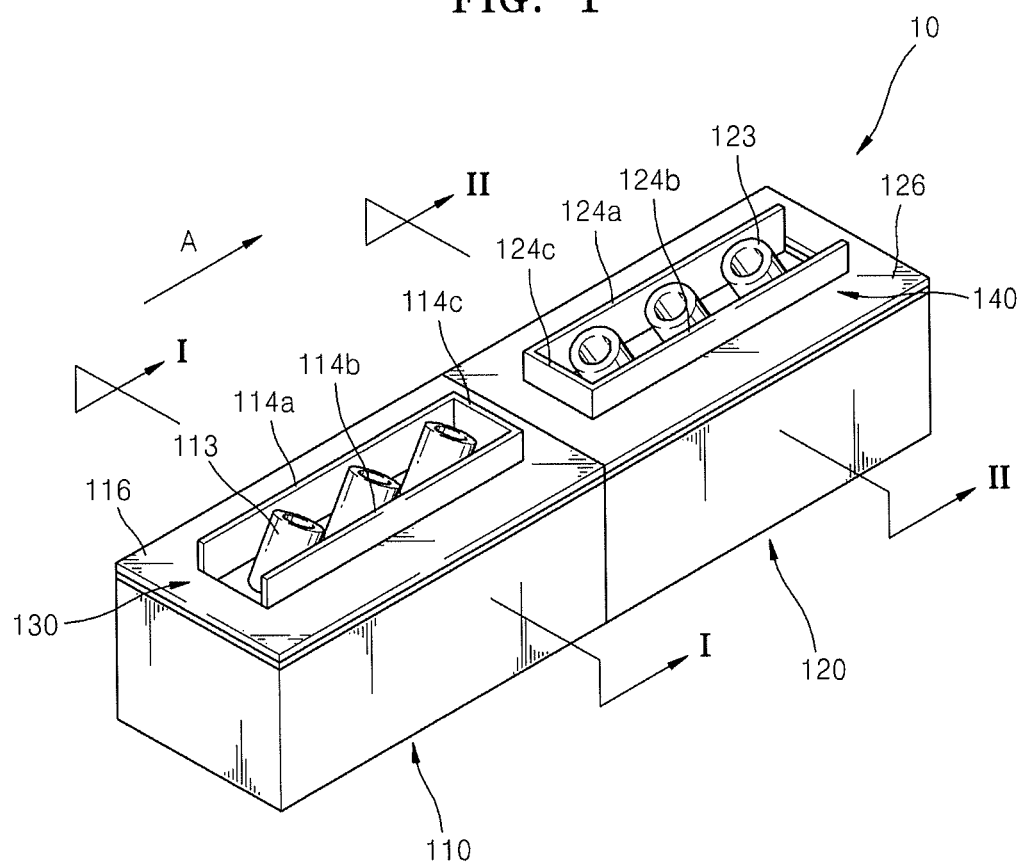
FIG. 1 is a schematic perspective view of a deposition source according to an embodiment of the present invention.
Figure 2A:
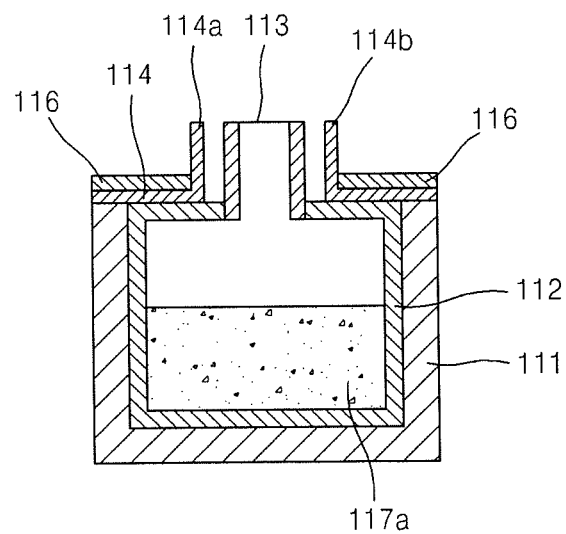
FIG. 2A is a cross-sectional view of the deposition source of FIG. 1, taken along the line I-I.
Figure 2B:
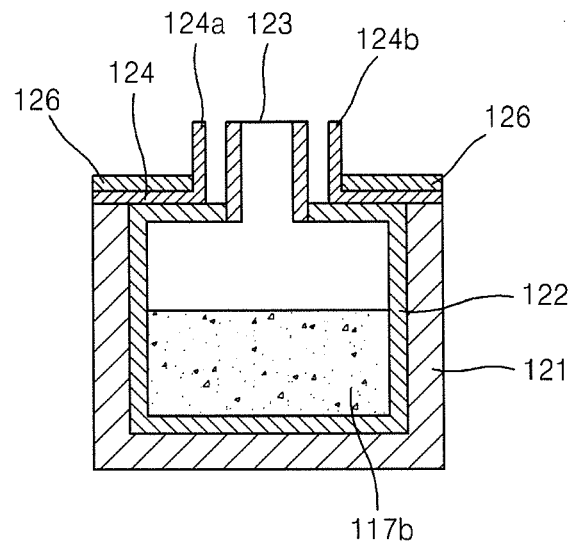
FIG. 2B is a cross-sectional view of the deposition source of FIG. 1, taken along the line II-II.

FIG. 1 is a schematic perspective view of a deposition source 10 according to an embodiment of the present invention. FIG. 2A is a cross-sectional view taken along the line I-I of FIG. 1. FIG. 2B is a cross-sectional view taken along the line II-II of FIG. 1.

Figure 4:
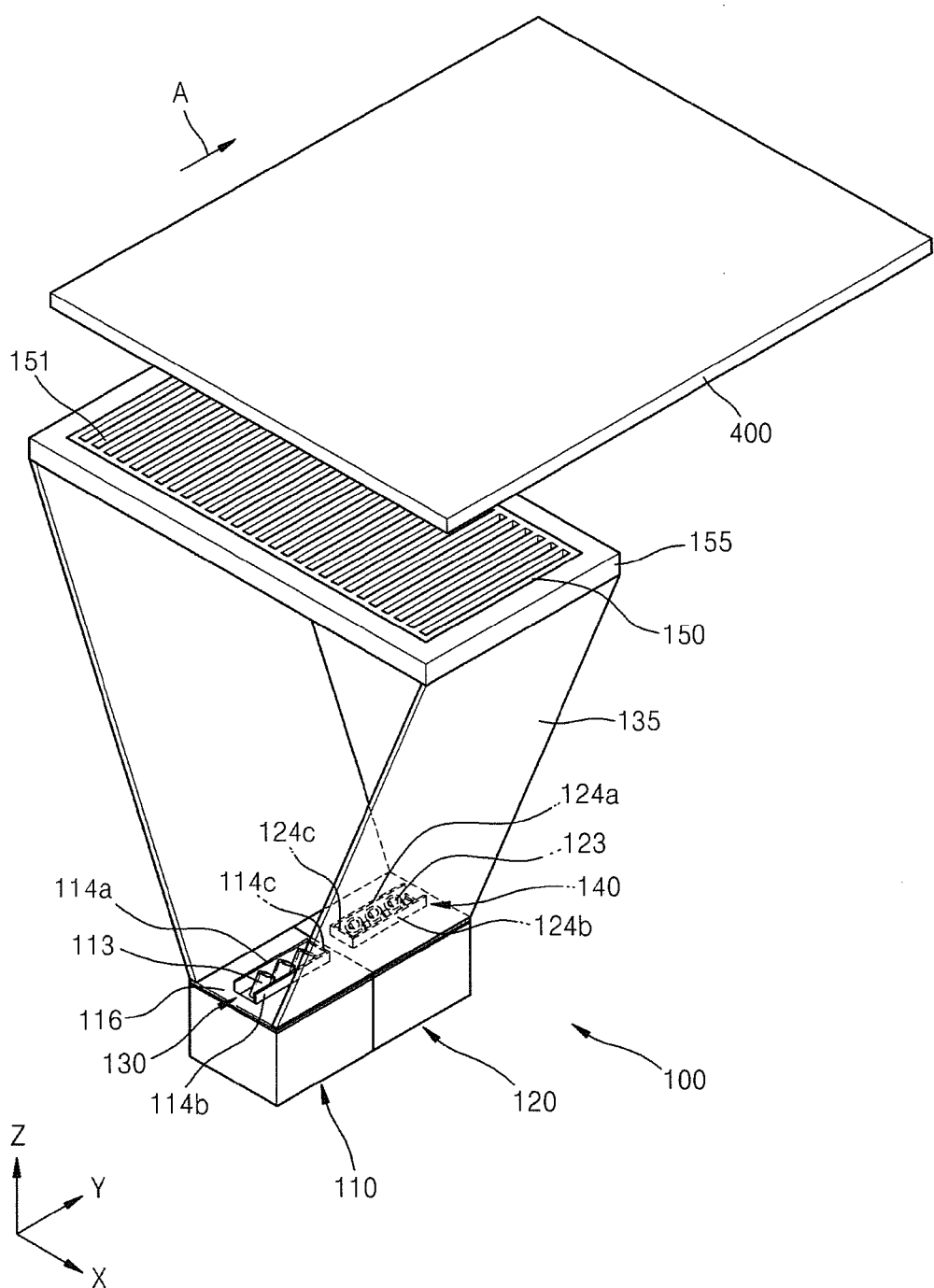
FIG. 4 is a schematic perspective view of an organic layer deposition apparatus according to an embodiment of the present invention.

Referring to FIGS. 1 to 2B, the deposition source 10 according to one embodiment may include a first deposition source 110 and a second deposition source 120. A thin film is formed on a deposition target (e.g., a substrate 400, as illustrated in FIG. 4) by vaporizing a first deposition material 117*a* and a second deposition material 117*b* in the first deposition source 110 and the second deposition source 120, respectively. The first and second deposition sources 110 and 120 may be linear deposition sources.

Specifically, the first deposition source 110 may contain a host material as the first deposition material 117*a*, and the second deposition source 120 may contain a dopant material as the second deposition material 117*b*. Alternatively, the first deposition source 110 may contain a dopant material as the first deposition material 117*a*, and the second deposition source 120 may contain a host material as the second deposition material 117*b*. Since the host material and the dopant material are vaporized at different temperatures, the first and second deposition sources 110 and 120 and first and second deposition source nozzle units 130 and 140 are provided to deposit the host material and the dopant material at the same time.

Specifically, the first deposition source 110 includes a crucible 111 filled with the first deposition material 117*a*, and a heater 112 that heats the crucible 111 to vaporize the first deposition material 117*a* toward a side of the crucible 111, and in particular, toward the substrate 400. The second deposition source 120 includes a crucible 121 filled with the second deposition material 117*b*, and a heater 122 that heats the crucible 121 to vaporize the second deposition material 117*b* toward a side of the crucible 121, and in particular, toward the substrate 400.

Examples of the host material may include tris(8-hydroxy-quinolinato)aluminum (Alq3), 9,10-di(naphth-2-yl) anthracene (AND), 3-tert-butyl-9,10-di(naphth-2-yl)anthracene (TBADN), 4,4'-bis(2,2-diphenyl-ethene-1-yl)-4,4'-dimethylphenyl (DPVBi), 4,4'-bis(2,2-diphenyl-ethene-1-yl)-4,4'-dimethylphenyl (p-DMDPVBi), tert(9,9-diarylfluorene)s (TDAF), 2-(9,9'-spirobifluorene-2-yl)-9,9'-spirobifluorene (BSDF), 2,7-bis(9,9'-spirobifluorene-2-yl)-9,9'-spirobifluorene (TSDF), bis(9,9-diarylfluorene)s (BDAF), 4,4'-bis(2,2-diphenyl-ethene-1-yl)-4,4'-di-(tert-butyl)phenyl (p-TDPVBi), 1,3-bis(carbazol-9-yl)benzene (mCP), 1,3,5-tris(carbazol-9-yl)benzene (tCP), 4,4',4''-tris (carbazol-9-yl)triphenylamine (TcTa), 4,4'-bis(carbazol-9-yl)biphenyl (CBP), 4,4'-bis(9-carbazolyl)-2,2'-dimethyl-biphenyl (CBDP), 4,4'-bis(carbazol-9-yl)-9,9-dimethylfluorene (DMFL-CBP), 4,4'-bis(carbazol-9-yl)-9,9-bis(9-phenyl-9H-carbazol)fluorene (FL-4CBP), 4,4'-bis(carbazol-9-yl)-9,9-di-tolyl-fluorene (DPFL-CBP), 9,9-bis(9-phenyl-9H-carbazol)fluorene (FL-2CBP), and the like.

Examples of the dopant material may include 4,4'-bis[4-(di-p-tolylamino)styryl]biphenyl (DPAVBi), 9,10-di(naph-2-tyl)anthracene (ADN), 3-tert-butyl-9,10-di(naph-2-tyl)anthracene (TBADN), and the like.

The first and second deposition source nozzle units 130 and 140 are disposed at a side of the first deposition source 110 and a side of the second deposition source 120, respectively, and particularly, at a side of the first deposition source 110 and a side of the second deposition source 120 that face the substrate 400. A plurality of first deposition source nozzles 113 are formed in the first deposition source nozzle unit 130 and a plurality of second deposition source nozzles 123 are formed in the second deposition source nozzle unit 140, in a moving direction (scanning direction) A in which the substrate 400 is moved. The plurality of first and second deposition source nozzles 113 and 123 may be arranged at equal intervals. The first deposition material 117*a* and the second deposition material 117*b*, which are vaporized in the first and second deposition sources 110 and 120, pass through the first deposition source nozzle unit 130 and the second deposition source nozzle unit 140, respectively, and then move toward the substrate 400.

Since the plurality of first and second deposition source nozzles 113 and 123 are arranged in the scanning direction A, even if there is a difference in flux between the pluralities of first and second deposition source nozzles 113 and 123, the difference may be compensated for and deposition uniformity may be maintained constant.

The pluralities of first and second deposition source nozzle units 113 and 123 formed in the first and second deposition nozzle units 130 and 140 may be tilted at a predetermined angle. In one embodiment, the plurality of first deposition source nozzles 113 and the plurality of second deposition source nozzles 123 may be tilted to face each other.

Although the amount of the second deposition material 117*b* contained may vary depending on a thin film forming material, the second deposition material 117*b* contained may be about 3 to about 20 parts by weight in the thin film forming material (total weight of the host and dopant materials 117*a* and 117*b*) of 100 parts by weight. If the second deposition material 117*b* content exceeds the above described range, the light-emitting property of an organic light-emitting display apparatus may be degraded. If the first and second deposition source nozzles 113 and 123 are not tilted and are arranged in parallel with the substrate 400, then the second deposition material 117*b* is deposited on the substrate 400 at an initial stage of a deposition process, the second deposition material 117*b* and the first deposition material 117*a* are alternately deposited on the substrate 400 during a middle stage of the deposition process, and the first deposition material 117*a* is deposited on the substrate 400 during a final stage of the deposition process. That is, a mixture ratio of the first deposition material 117*a* and the second deposition material 117*b* may vary depending on regions of the substrate 400.

Thus, in one embodiment, the pluralities of first and second deposition source nozzles 113 and 123 are tilted at a predetermined angle. The first deposition source nozzles 113 of the first deposition source nozzle unit 130 and the second deposition source nozzles 123 of the second deposition source nozzle unit 140 may be tilted to face each other. That is, the first deposition source nozzles 113 of the first deposition source nozzle unit 130 may be tilted to face the second deposition source 120, and the second deposition source nozzles 123 of the second deposition source nozzle unit 140 may be tilted to face the first deposition source 110.

In the above-described structure, the mixing ratio of the first deposition material 117a and the second deposition material 117b may be maintained constant throughout the entire substrate 400. If a thin film is formed by using a mixture in which the first deposition material 117a and the second deposition material 117b are mixed at a constant mixture ratio, the thin film may exhibit improved characteristics in view of color coordinates, optical efficiency, driving voltage, and life span.

The first deposition source nozzle unit 130 may include reflectors 114, 114a, 114b, and 114c and a cooling plate 116, and the second deposition source nozzle unit 140 may include reflectors 124, 124a, 124b, and 124c and a cooling plate 126.

Specifically, the first deposition source nozzle unit 130 may include the upper reflector 114, the first protruding reflector 114a, the second protruding reflector 114b, the third protruding reflector 114c, and the cooling plate 116. The upper reflector 114 may be disposed on the first deposition source 110 and the heater 112. The upper reflector 114 may prevent or substantially prevent heat generated by the heater 112 from being emitted to the outside. The first and second protruding reflectors 114a and 114b, in one embodiment, extend from ends of the upper reflector 114 and toward a patterning slit sheet 150. The first and second protruding reflectors 114a and 114b, in one embodiment, are disposed apart from each other by a predetermined distance to be parallel with the plurality of first deposition source nozzles 113. The plurality of first deposition source nozzles 113 are arranged between the first and second protruding reflectors 114a and 114b. The third protruding reflector 114c, in one embodiment, extends from one end of the first protruding reflector 114a and one end of the second protruding reflector 114b to connect the first and second protruding reflectors 114a and 114b. In one embodiment, the third protruding reflector 114c is formed to connect one end of the first protruding reflector 114a and one end of the second protruding reflector 114b, which are adjacent to the second deposition source 120. The heights of the first to third protruding reflectors 114a, 114b, and 114c may be equal to or greater than those of the plurality of first deposition source nozzles 113.

Some of the first deposition material 117a discharged from the plurality of first deposition source nozzles 113 may flow to the cooling plate 116. The first deposition material 117a flowing to the cooling plate 116 is hardened, and the longer a deposition process is, the more first deposition material 117a may be hardened on the cooling plate 116 and may block the plurality of first deposition source nozzles 113. According to an embodiment of the present invention, the plurality of first deposition source nozzles 113 are tilted toward the plurality of second deposition source nozzles 123. However, in an embodiment of the present invention, since the first to third protruding reflectors 114a to 114c surround the plurality of first deposition source nozzles 113, the plurality of first deposition source nozzles 113 are prevented or substantially prevented from being blocked by the first deposition material 117a that hardens and grows on the cooling plate 116.

The second deposition source nozzle unit 140 may include the upper reflector 124, the fourth protruding reflector 124a, the fifth protruding reflector 124b, the sixth protruding reflector 124c, and the cooling plate 126. The upper reflector 124 is disposed on the second deposition source 120 and the heater 122. The upper reflector 124 may prevent or substantially prevent heat generated by the heater 122 from being emitted to the outside. The fourth and fifth protruding reflectors 124a and 124b, in one embodiment, extend from one end of the upper reflector 124 and toward the patterning slit sheet 150. The fourth and fifth protruding reflectors 124a and 124b, in one embodiment, are disposed apart from each other by a predetermined distance to be parallel with the plurality of second deposition source nozzles 123. The plurality of second deposition source nozzles 123 are arranged between the fourth and fifth protruding reflectors 124a and 124b. The sixth protruding reflector 124c, in one embodiment, extends from one end of the fourth protruding reflector 124a and one end of the fifth protruding reflector 124b to connect the fourth and fifth protruding reflectors 124a and 124b. In particular, the sixth protruding reflector 124c is formed to connect one end of the fourth protruding reflector 124a and one end of the fifth protruding reflector 124b which are adjacent to the first deposition source 110. The heights of the fourth to sixth protruding reflectors 124a, 124b, and 124c may be equal to or greater than those of the plurality of second deposition source nozzles 123.

Some of the second deposition material 117b discharged from the plurality of second deposition source nozzles 123 may flow to the cooling plate 126. The second deposition material 117b flowing to the cooling plate 126 is hardened, and the longer a deposition process is, the more second deposition material 117b may be hardened on the cooling plate 126 and may block the plurality of second deposition source nozzles 123. According to an embodiment of the present invention, the plurality of second deposition source nozzles 123 are tilted toward the plurality of first deposition source nozzles 113. However, in an embodiment of the present invention, since the fourth to sixth protruding reflectors 124a to 124c surround the plurality of second deposition source nozzles 123, the plurality of second deposition source nozzles 123 are prevented or substantially prevented from being blocked by the second deposition material 117b that hardens and grows on the cooling plate 126.

Figure 2C:
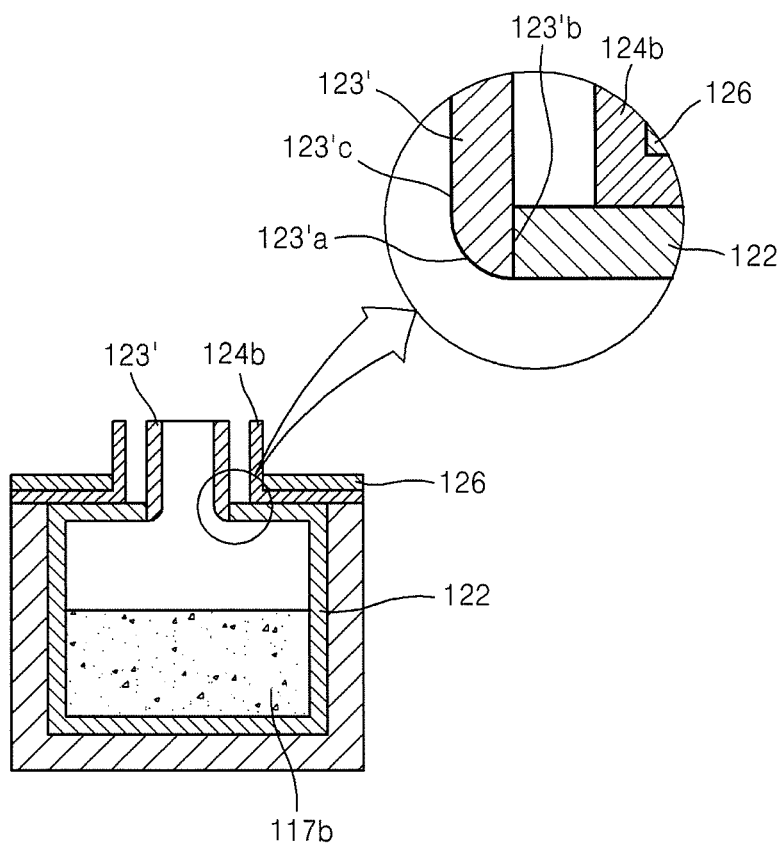
FIG. 2C is a cross-sectional view of a modified example of the deposition source of FIG. 1.
Figure 2D:
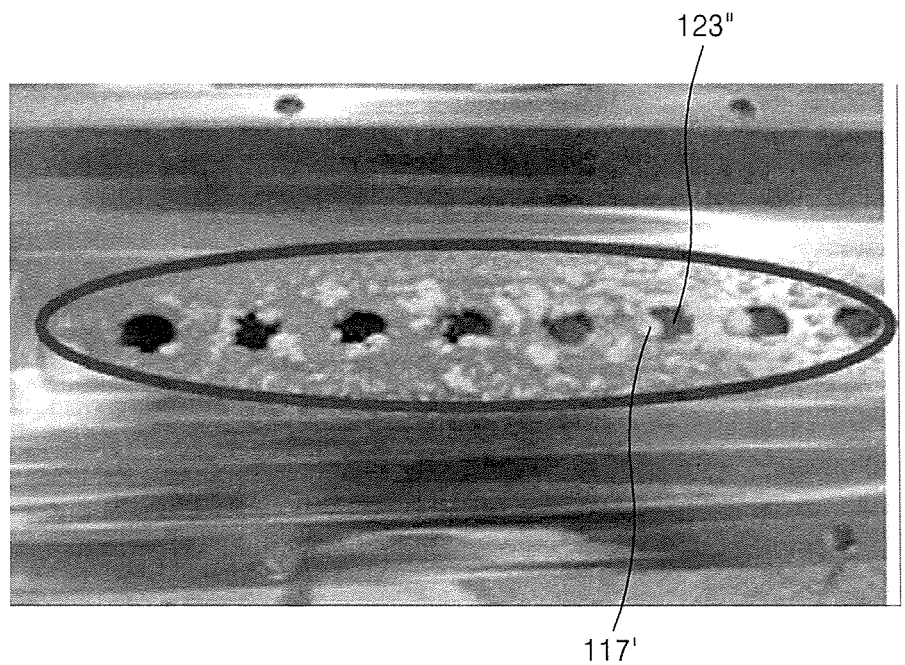
FIG. 2D is a photograph showing a lower part of a deposition source nozzle, at which a deposition material is deposited.

FIG. 2C is a cross-sectional view of a modified example of the deposition source of FIG. 1. FIG. 2D is a photograph showing a lower part of a deposition source nozzle 123" in which a deposition material is deposited.

Referring to FIG. 2C, lower end portions of a second deposition source nozzle 123' each have a curved surface 123'a. In other words, in the second deposition source nozzle 123', the lower end portions each formed by an external side surface 123'c and an internal side surface 123'b have the curved surface 123'a, unlike the second deposition source nozzle 123 shown in FIG. 2B. Also, although not shown, lower end portions of a first deposition source nozzle may each have a curved surface.

In contrast, referring to FIG. 2D, lower end portions of the second deposition source nozzle 123" each have a corner, unlike the lower end portions of the second deposition source nozzle 123' each having the curved surface 123'a. Thus, as a deposition material 117' is discharged via the second deposition source nozzle 123", the deposition material 117' is continuously deposited at the lower end portions having the corners of the second deposition source nozzle 123". Thus, the lower end portions of the second deposition source nozzle 123" may be blocked by the deposition material 117'.

Figure 3:
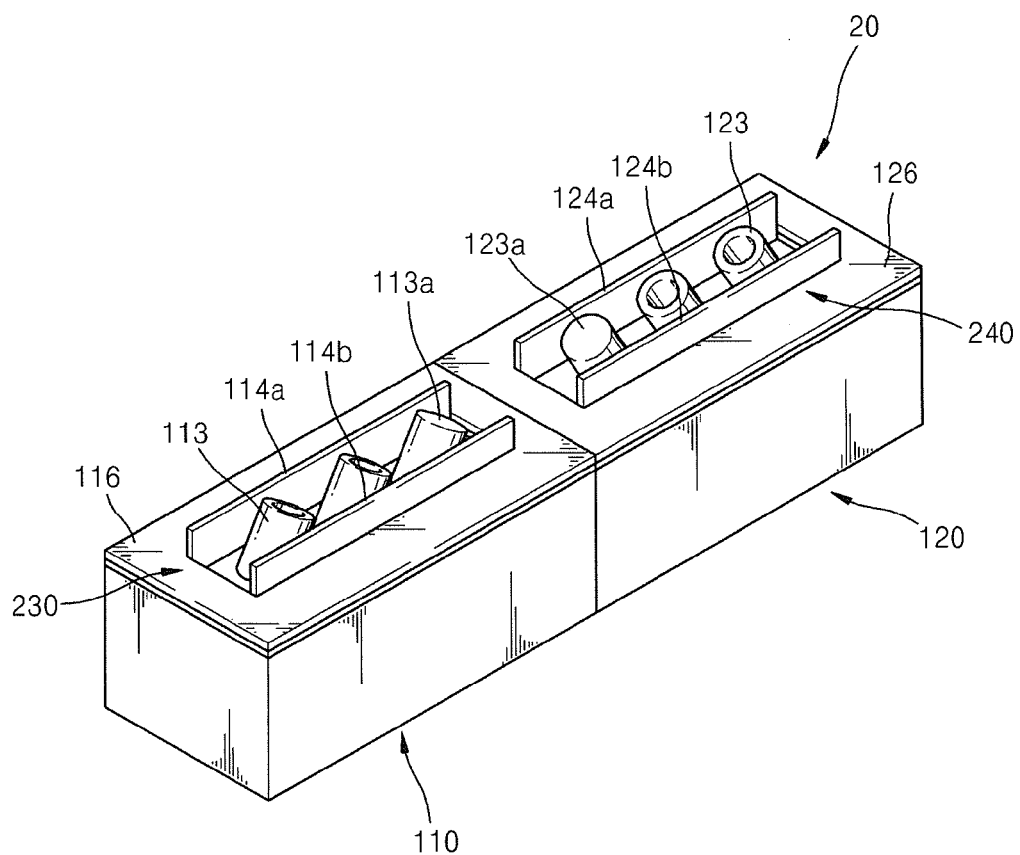
FIG. 3 is a schematic perspective view of a deposition source according to another embodiment of the present invention.

FIG. 3 is a schematic perspective view of a deposition source 20 according to another embodiment of the present invention. The deposition source 20 of FIG. 3 is the same as the deposition source 10 of FIG. 1 in that a first protruding reflector 114a and a second protruding reflector 114b are disposed at both sides of first deposition source nozzles 113 of a first deposition source nozzle unit 230, and a fourth protruding reflector 124a and a fifth protruding reflector 124b are disposed at both sides of second deposition source nozzles 123 of a second deposition source nozzle unit 240, but is different from the deposition source 10 in that a first dummy nozzle 113a and a second dummy nozzle 123a are formed in the first and second deposition source nozzle units 230 and 240, respectively, instead of the third and sixth protruding reflectors 114c and 124c included in the deposition source 10.

The first and second protruding reflectors 114a and 114b, in one embodiment, are disposed apart from each other by a predetermined distance to be parallel with the plurality of first deposition source nozzles 113. The plurality of first deposition source nozzles 113 are arranged between the first and second protruding reflectors 114a and 114b. The heights of the first and second protruding reflectors 114a and 114b may be equal to or greater than those of the plurality of first deposition source nozzles 113.

The first dummy nozzle 113a, in one embodiment, is closest to the second deposition source 120 from among the plurality of first deposition source nozzles 113, and has no aperture therein. Since the first dummy nozzle 113a has no aperture, a deposition material contained in a first deposition source 110 is not discharged via the first dummy nozzle 113a. A first deposition source nozzle from among the plurality of first deposition source nozzles 113 of the deposition source 10 of FIG. 1 is most likely to be blocked by a deposition material, but in the deposition source 20 of FIG. 3, a first deposition source nozzle from among the plurality of first deposition source nozzles 113 is the first dummy nozzle 113a and, therefore, is not blocked by a deposition material.

The fourth and fifth protruding reflectors 124a and 124b, in one embodiment, are disposed apart from each other by a predetermined distance to be parallel with the plurality of second deposition source nozzles 123. The plurality of second deposition source nozzles 123 are arranged between the fourth and fifth protruding reflectors 124a and 124b. The heights of the fourth and fifth protruding reflectors 124a and 124b may be equal to or greater than those of the plurality of second deposition source nozzles 123.

The second dummy nozzle 123a, in one embodiment, is closest to the first deposition source 110 from among the plurality of second deposition source nozzles 123, and has no aperture therein. Since the second dummy nozzle 123a has no aperture, a deposition material contained in a second deposition source 120 is not discharged via the second dummy nozzle 123a. A first deposition source nozzle from among the plurality of second deposition source nozzles 123 of the deposition source 10 of FIG. 1 is most likely to be blocked by a deposition material, but in the deposition source 20 of FIG. 3, a first deposition source nozzle from among the plurality of second deposition source nozzles 123 is the second dummy nozzle 123a and, therefore, is not blocked by a deposition material.

Figure 5:
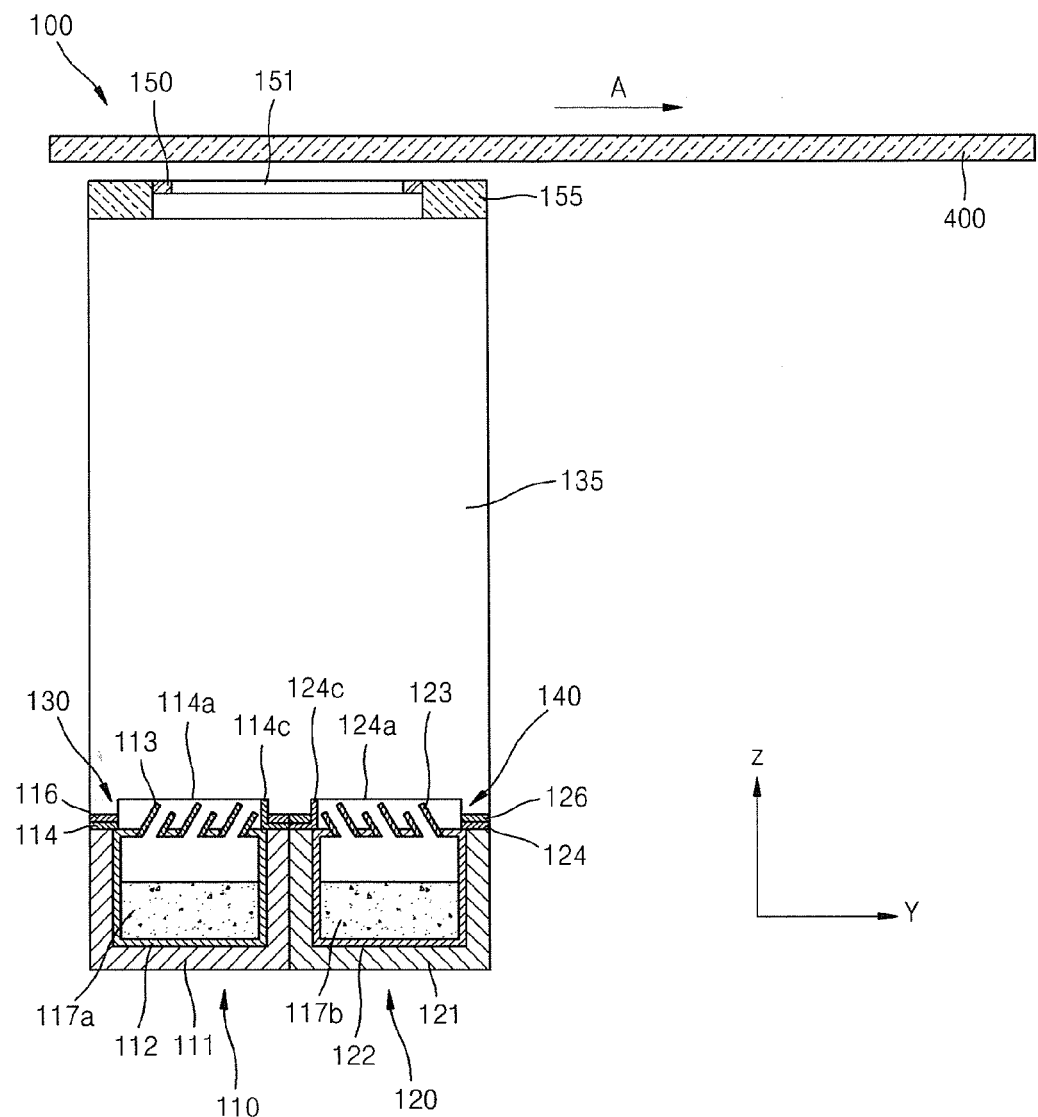
FIG. 5 is a schematic side cross-sectional view of the organic layer deposition apparatus of FIG. 4.
Figure 6:
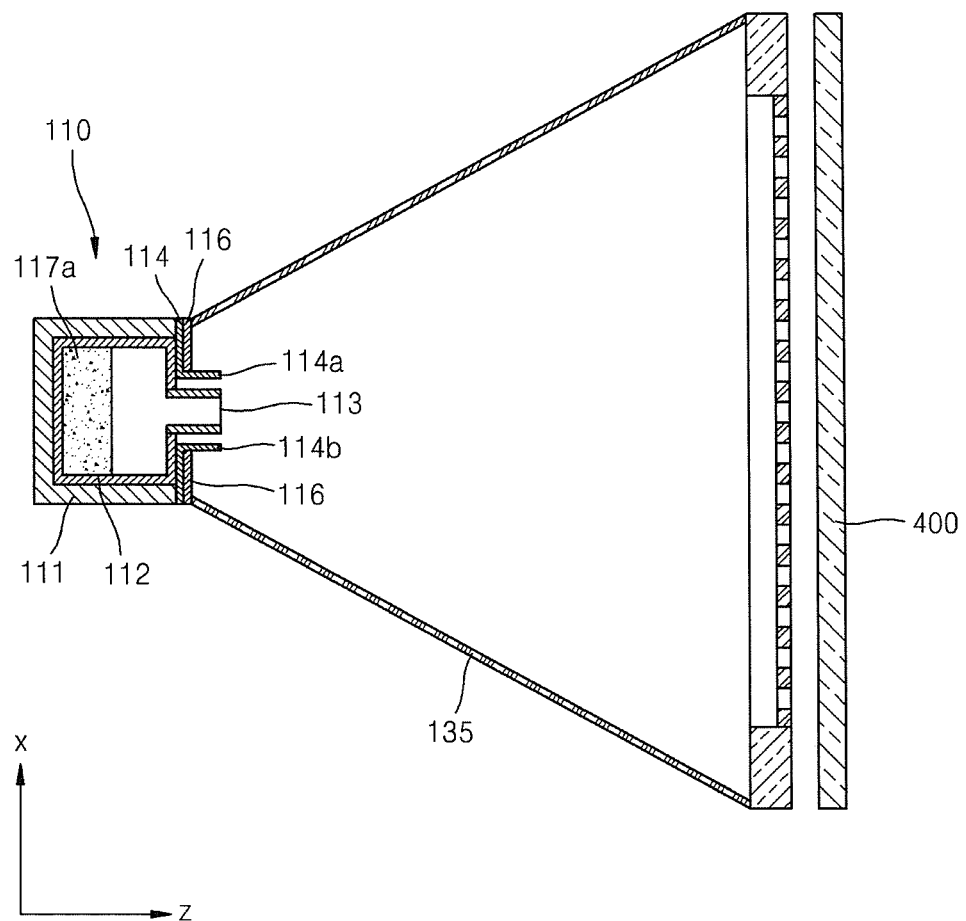
FIG. 6 is a schematic front cross-sectional view of the organic layer deposition apparatus of FIG. 4.

FIG. 4 is a schematic perspective view of an organic layer deposition apparatus 100 according to an embodiment of the present invention. FIG. 5 is a schematic side cross-sectional view of the organic layer deposition apparatus 100 of FIG. 4. FIG. 6 is a schematic front cross-sectional view of the organic layer deposition apparatus 100 of FIG. 4.

Referring to FIGS. 4 to 6, the organic layer deposition apparatus 100 according to one embodiment includes the first deposition source 110, the second deposition source 120, the first deposition source nozzle unit 130, the second deposition source nozzle unit 140, and the patterning slit sheet 150.

Although a chamber is not illustrated in FIGS. 4 to 6 for reasons of clarity, all the components of the organic layer deposition apparatus 100 may be disposed within a chamber that is maintained at an appropriate degree of vacuum. The chamber may be maintained at an appropriate vacuum in order to allow the first and second deposition materials 117a and 117b to move in a substantially straight line through the organic layer deposition apparatus 100.

In particular, in order to deposit the first and second deposition materials 117a and 117b that are emitted from the first and second deposition sources 110 and 120 and are discharged through the first and second deposition source nozzle units 130 and 140 and the patterning slit sheet 150 onto a substrate 400 in a desired pattern, it is required to maintain the chamber in a high-vacuum state as in a deposition method using a fine metal mask (FMM). In addition, the temperature of the patterning slit sheet 150 should be sufficiently lower than the temperatures of the first and second deposition sources 110 and 120. In one embodiment, the temperature of the patterning slit sheet 150 may be about 100° C. or less. The temperature of the patterning slit sheet 150 should be sufficiently low so as to reduce thermal expansion of the patterning slit sheet 150.

The substrate 400, which is a deposition target substrate, is disposed in the chamber. The substrate 400 may be a substrate for flat panel displays. A large substrate, such as a mother glass for manufacturing a plurality of flat panel displays, may be used as the substrate 400. Other types of substrates may also be employed.

In one embodiment, deposition is performed while the substrate 400 is moved relative to the organic layer deposition apparatus 100.

In particular, in a conventional deposition method using an FMM, the size of the FMM has to be equal to the size of a substrate. Thus, the size of the FMM has to be increased as the substrate becomes larger, and it is neither straightforward to manufacture a large FMM nor to extend an FMM to be accurately aligned with a pattern.

In order to overcome this problem, in the organic layer deposition apparatus 100 according to an embodiment of the present invention, deposition may be performed while the organic layer deposition apparatus 100 or the substrate 400 is moved relative to the other. In other words, deposition may be continuously performed while the substrate 400, which is disposed so as to face the organic layer deposition apparatus 100, is moved (e.g., in a Y-axis direction). In other words, deposition may be performed in a scanning manner while the substrate 400 is moved (e.g., in a direction of arrow A in FIG. 4). Further, although the substrate 400 is illustrated as being moved in the Y-axis direction in FIG. 4 when deposition is performed, embodiments of the present invention are not limited thereto. For example, in another embodiment, deposition may be performed while the organic layer deposition assembly 100 is moved (e.g., in the Y-axis direction), whereas the substrate 400 is fixed.

In the organic layer deposition apparatus 100 according to an embodiment of the present invention, the patterning slit sheet 150 may be significantly smaller than a FMM used in a conventional deposition method. In other words, in the organic layer deposition apparatus 100 according to one embodiment, deposition is continuously performed, i.e. in a scanning manner, while the substrate 400 is moved in the Y-axis direction. Thus, lengths of the patterning slit sheet 150 in the X-axis and Y-axis directions may be significantly less than lengths of the substrate 400 in the X-axis and Y-axis directions. As described above, since the patterning slit sheet 150 may be formed to be significantly smaller than an FMM used in a conventional deposition method, it is relatively easy to manufacture the patterning slit sheet 150. In other words, using the patterning slit sheet 150, which is smaller than the FMM used in the conventional deposition method, is more convenient in all processes, including etching and other subsequent processes, such as precise extension, welding, moving, and cleaning processes, compared to the conventional deposition method using the larger FMM. This is especially advantageous for manufacturing a relatively large display apparatus.

In order to perform deposition while the organic layer deposition apparatus 100 or the substrate 400 is moved relative to the other as described above, the organic layer deposition apparatus 100 and the substrate 400 may be separated from each other by a predetermined distance. This will be described later in further detail.

The first and second deposition sources 110 and 120 that contain and heat the first and second deposition materials 117a and 117b, respectively, are disposed in an opposite side of the chamber to a side in which the substrate 400 is disposed. While the first and second deposition materials 117a and 117b contained in the first and second deposition sources 110 and 120 are vaporized, the first and second deposition materials 117a and 117b are deposited on the substrate 400.

Specifically, the first deposition source 110 may contain a host material as the first deposition material 117a, and the second deposition source 120 may contain a dopant material as the second deposition material 117b. That is, since the host material and the dopant material are vaporized at different temperatures, the first and second deposition sources 110 and 120 and the first and second deposition source nozzle units 130 and 140 are provided to deposit the host material and the dopant material at the same time.

In particular, the first and second deposition sources 110 and 120 that contain and heat the host material and the dopant material, respectively, are disposed in an opposite side of the chamber to that in which the substrate 400 is disposed. As the host material and the dopant material contained in the first and second deposition sources 110 and 120 are vaporized, the host material and the dopant material are deposited on the substrate 400. In particular, the first deposition source 110 includes the crucible 111 that is filled with the host material, and the heater 112 that heats the crucible 111 to vaporize the host material, which is contained in the crucible 111, toward a side of the crucible 111, and in particular, toward the first deposition source nozzle unit 130. The second deposition source 120 includes the crucible 121 that is filled with the dopant material, and the heater 122 that heats the crucible 121 to vaporize the dopant material, which is contained in the crucible 121, toward a side of the crucible 121, and in particular, toward the second deposition nozzle unit 140.

Examples of the host material may include tris(8-hydroxy-quinolinato)aluminum (Alq3), 9,10-di(naphth-2-yl)anthracene (AND), 3-tert-butyl-9,10-di(naphth-2-yl)anthracene (TBADN), 4,4'-bis(2,2-diphenyl-ethene-1-yl)-4,4'-dimethylphenyl (DPVBi), 4,4'-bis(2,2-diphenyl-ethene-1-yl)-4,4'-dimethylphenyl (p-DMDPVBi), tert(9,9-diarylfluorene)s (TDAF), 2-(9,9'-spirobifluorene-2-yl)-9,9'-spirobifluorene (BSDF), 2,7-bis(9,9'-spirobifluorene-2-yl)-9,9'-spirobifluorene (TSDF), bis(9,9-diarylfluorene)s (BDAF), 4,4'-bis(2,2-diphenyl-ethene-1-yl)-4,4'-di-(tert-butyl)phenyl (p-TDPVBi), 1,3-bis(carbazol-9-yl)benzene (mCP), 1,3,5-tris(carbazol-9-yl)benzene (tCP), 4,4',4"-tris(carbazol-9-yl)triphenylamine (TcTa), 4,4'-bis(carbazol-9-yl)biphenyl (CBP), 4,4'-bis(9-carbazolyl)-2,2'-dimethyl-biphenyl (CBDP), 4,4'-bis(carbazol-9-yl)-9,9-dimethyl-fluorene (DMFL-CBP), 4,4'-bis(carbazol-9-yl)-9,9-bis(9-phenyl-9H-carbazol)fluorene (FL-4CBP), 4,4'-bis(carbazol-9-yl)-9,9-di-tolyl-fluorene (DPFL-CBP), 9,9-bis(9-phenyl-9H-carbazol)fluorene (FL-2CBP), and the like.

Examples of the dopant material may include 4,4'-bis[4-(di-p-tolylamino)styryl]biphenyl (DPAVBi), 9,10-di(naph-2-tyl)anthracene (ADN), 3-tert-butyl-9,10-di(naph-2-tyl)anthracene (TBADN), and the like.

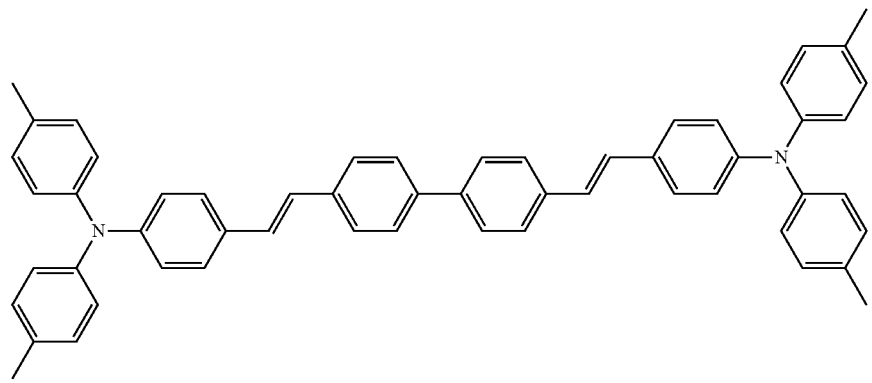

DPAVBi

-continued

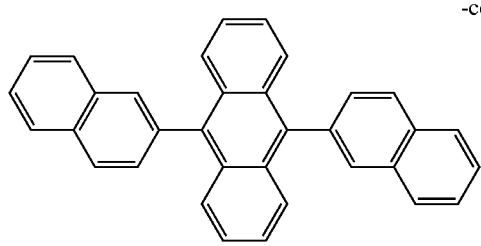

ADN

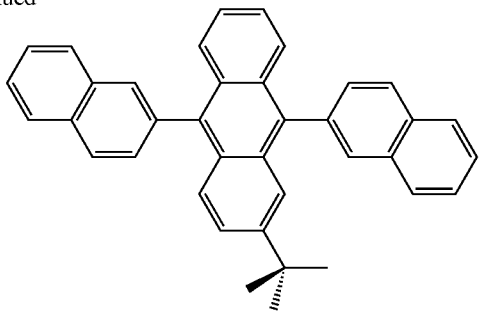

TBADN

As described above, the organic layer deposition apparatus 100 according to one embodiment is characterized in that the first deposition source 110 that contains the host material and the second deposition source 120 that contains the dopant material are provided so that the host material and the dopant material may be simultaneously deposited on the substrate 400. Since the host material and the dopant material may be simultaneously deposited on the substrate 400, the deposition process may be simplified and performed rapidly, and device efficiency may also be improved.

The first and second deposition source nozzle units 130 and 140 are disposed at a side of the first deposition source 110 and a side of the second deposition source 120, respectively, and particularly, at a side of the first deposition source 110 and a side of the second deposition source 120 that face the substrate 400. In one embodiment, the plurality of first deposition source nozzles 113 are formed in the first deposition source nozzle unit 130 and the plurality of second deposition source nozzles 123 are formed in the second deposition source nozzle unit 140 in the Y-axis direction, i.e. in a scanning direction of the substrate 400. The plurality of first and second deposition source nozzles 113 and 123 may be arranged at equal intervals. The host material and the dopant material, which are vaporized in the first and second deposition sources 110 and 120, respectively, pass through the first deposition source nozzle unit 130 and the second deposition source nozzle unit 140, respectively, and then move toward the substrate 400. As described above, according to one embodiment, when the plurality of first deposition source nozzles 113 are formed in the first deposition source nozzle unit 130 and the plurality of second deposition source nozzles 123 are formed in the second deposition source nozzle unit 140 in the Y-axis direction, i.e. the scanning direction of the substrate 400, the size of a pattern formed of the host material or the dopant material discharged through each of a plurality of patterning slits 151 of the patterning slit sheet 150 is affected by the size of one of the first and second deposition source nozzles 113 and 123 (since there is only one line of the first and second deposition source nozzles 113 and 123 in the X-axis direction). Thus, no shadow zone may be formed on the substrate 400. Since the plurality of first and second deposition source nozzles 113 and 123 are arranged in the scanning direction, even if there is a difference in flux between the plurality of first and second deposition source nozzles 113 and 123, the difference may be compensated for and deposition uniformity may be maintained constant.

The plurality of first and second deposition source nozzle units 113 and 123 formed in the first and second deposition source nozzle units 130 and 140 may be tilted at a predetermined angle. That is, the plurality of first and second deposition source nozzles 113 and 123 may be tilted at a predetermined angle on a Y-Z plane.

Although the second deposition material 117b contained may vary depending on the material for forming thin films, the second deposition material 117b contained, in one embodiment, is about 3 to about 20 parts by weight in the thin film forming material (total weight of the host and dopant materials 117a and 117b) of 100 parts by weight. If the second deposition material 117b content exceeds the above described range, the light-emitting property of an organic light-emitting display apparatus may be degraded. If the first and second deposition source nozzles 113 and 123 are not tilted and are arranged in parallel with a Z-axis, then the second deposition material 117b is deposited on the substrate 400 at an initial stage of a deposition process, the second deposition material 117b and the first deposition material 117a are alternately deposited on the substrate 400 during a middle stage of the deposition process, and the first deposition material 117a is deposited on the substrate 400 during a final stage of the deposition process. That is, a mixture ratio of the first deposition material 117a and the second deposition material 117b may vary depending on regions of the substrate 400.

Thus, in one embodiment, the plurality of first and second deposition source nozzles 113 and 123 are tilted at a predetermined angle. The plurality of first deposition source nozzles 113 of the first deposition source nozzle unit 130 and the plurality of second deposition source nozzles 123 of the second deposition source nozzle unit 140 may be tilted to face each other. That is, in one embodiment, the deposition source nozzles 113 of the first deposition source nozzle unit 130 are tilted to face the second deposition source 120, and the deposition source nozzles 123 of the second deposition source nozzle unit 140 are tilted to face the first deposition source 110.

In the above described structure, the mixing ratio of the first deposition material 117a and the second deposition material 117b may be maintained constant throughout the entire substrate 400. If a thin film is formed by using a mixture in which the first deposition material 117a and the second deposition material 117b are mixed at a constant mixture ratio, the thin film may exhibit improved characteristics in view of color coordinates, optical efficiency, driving voltage, and life span.

The first deposition source nozzle unit 130 may include the reflectors 114, 114a, 114b, and 114c and the cooling plate 116, and the second deposition source nozzle unit 140 may include the reflectors 124, 124a, 124b, and 124c and the cooling plate 126.

In one embodiment, the first deposition source nozzle unit 130 includes the upper reflector 114, the first protruding reflector 114a, the second protruding reflector 114b, the third protruding reflector 114c, and the cooling plate 116. The upper reflector 114 is disposed on the first deposition source 110 and the heater 112. The upper reflector 114 may prevent or substantially prevent heat generated by the heater 112 from being emitted to the outside. The first and second protruding reflectors 114a and 114b, in one embodiment, extend from one end of the upper reflector 114 and toward the patterning slit sheet 150. The first and second protruding reflectors 114a and 114b, in one embodiment, are disposed apart from each other by a predetermined distance to be parallel with the plurality of first deposition source nozzles 113. The plurality of first deposition source nozzles 113 are arranged between the first and second protruding reflectors 114a and 114b. The third protruding reflector 114c, in one embodiment, extends from one end of the first protruding reflector 114a and one end of the second protruding reflector 114b to connect the first and second protruding reflectors 114a and 114b. In one embodiment, the third protruding reflector 114c is formed to connect one end of the first protruding reflector 114a and one end of the second protruding reflector 114b, which are adjacent to the second deposition source 120. The heights of the first to third protruding reflectors 114a, 114b, and 114c may be equal to or greater than those of the plurality of first deposition source nozzles 113.

Some of the first deposition material 117a discharged from the plurality of first deposition source nozzles 113 may flow to the cooling plate 116. The first deposition material 117a flowing to the cooling plate 116 is hardened, and the longer a deposition process is, the more first deposition material 117a may be hardened on the cooling plate 116, thereby blocking the plurality of first deposition source nozzles 113. According to an embodiment of the present invention, the plurality of first deposition source nozzles 113 are tilted toward the plurality of second deposition source nozzles 123. However, in an embodiment of the present invention, since the first to third protruding reflectors 114a to 114c surround the plurality of first deposition source nozzles 113, the plurality of first deposition source nozzles 113 are prevented or substantially prevented from being blocked by the first deposition material 117a that hardens on the cooling plate 116.

The second deposition source nozzle unit 140, in one embodiment, includes the upper reflector 124, the fourth protruding reflector 124a, the fifth protruding reflector 124b, the sixth protruding reflector 124c, and the cooling plate 126. The upper reflector 124 is disposed on the second deposition source 120 and the heater 122. The upper reflector 124 may prevent or substantially prevent heat generated by the heater 122 from being emitted to the outside. The fourth and fifth protruding reflectors 124a and 124b extend from one end of the upper reflector 124 and toward the patterning slit sheet 150. The fourth and fifth protruding reflectors 124a and 124b, in one embodiment, are disposed apart from each other by a predetermined distance to be parallel with the plurality of second deposition source nozzles 123. The plurality of second deposition source nozzles 123 are arranged between the fourth and fifth protruding reflectors 124a and 124b. The sixth protruding reflector 124c extends from one end of the fourth protruding reflector 124a and one end of the fifth protruding reflector 124b to connect the fourth and fifth protruding reflectors 124a and 124b. In one embodiment, the sixth protruding reflector 124c is formed to connect one end of the fourth protruding reflector 124a and one end of the fifth protruding reflector 124b, which are adjacent to the first deposition source 110. The heights of the fourth to sixth protruding reflectors 124a, 124b, and 124c may be equal to or greater than those of the plurality of second deposition source nozzles 123.

Some of the second deposition material 117b discharged from the plurality of second deposition source nozzles 123 may flow to the cooling plate 126. The second deposition material 117b flowing to the cooling plate 126 is hardened, and the longer a deposition process is, the more second deposition material 117b may be hardened on the cooling plate 126, thereby blocking the plurality of second deposition source nozzles 123. According to one embodiment of the present invention, the plurality of second deposition source nozzles 123 are tilted toward the plurality of first deposition source nozzles 113. However, in an embodiment of the present invention, since the fourth to sixth protruding reflectors 124a to 124c surround the plurality of second deposition source nozzles 123, the plurality of second deposition source nozzles 123 are prevented or substantially prevented from being blocked by the second deposition material 117b that hardens on the cooling plate 126.

The patterning slit sheet 150 and a frame 155 are disposed between the first and second deposition sources 110 and 120 and the substrate 400. A shape of the frame 155 may be similar to that of a window frame. The patterning slit sheet 150 may be bound inside the frame 155. The patterning slit sheet 150 includes the plurality of patterning slits 151 arranged in the X-axis direction. The first deposition material 117a and the second deposition material 117b, which are vaporized in the first and second deposition sources 110 and 120, pass through the first deposition source nozzle unit 130, the second deposition source nozzle unit 140, and the patterning slit sheet 150, and then move toward the substrate 400. The patterning slit sheet 150 may be manufactured by etching, which is the same method as used in a conventional method of manufacturing an FMM, and in particular, a striped FMM. A total number of the patterning slits 151 may be greater than a total number of the plurality of first and second deposition source nozzles 113 and 123.

The first and second deposition sources 110 and 120 and the first and second deposition source nozzle units 130 and 140 that are coupled to the first and second deposition sources 110 and 120, respectively, may be disposed to be separated from the patterning slit sheet 150 by a predetermined distance, and may be connected to the patterning slit sheet 150 by first connection members 135. That is, the first and second deposition sources 110 and 120, the first and second deposition source nozzle units 130 and 140, and the patterning slit sheet 150 may be formed as one body by being connected to each other via the first connection members 135. The connection members 135 may guide the first and second deposition materials 117a and 117b, which are discharged through the plurality of first and second deposition source nozzles 113 and 123, to move straight and not to flow in the X-axis direction. In FIG. 4, the connection members 135 are formed on left and right sides of the first and second deposition sources 110 and 120, the first and second deposition source nozzle units 130 and 140, and the patterning slit sheet 150 to guide the deposition materials 117a and 117b to not flow in the X-axis direction; however, embodiments of the present invention are not limited thereto. In another embodiment, for example, the connection members 135 may be formed in the form of a sealed box to guide flow of the deposition materials 117a and 117b both in the X-axis and Y-axis directions.

As described above, the organic layer deposition apparatus 100 according to an embodiment of the present invention performs deposition while being moved relative to the substrate 400. In order to move the organic layer deposition apparatus 100 relative to the substrate 400, the patterning slit sheet 150 is separated from the substrate 400 by a predetermined distance.

In a conventional deposition method using a FMM, deposition is performed with the FMM in close contact with a substrate in order to prevent formation of a shadow zone on the substrate. However, when the FMM is used in close contact with the substrate, defects may occur. In addition, in the conventional deposition method, the size of the mask has to be the same as the size of the substrate since the mask cannot be moved relative to the substrate. Thus, the size of the mask has to be increased as display apparatuses become larger. However, it is not easy to manufacture such a large mask.

In contrast, in the organic layer deposition apparatus 100 according to an embodiment of the present invention, the patterning slit sheet 150 is disposed to be separated from the substrate 400 by a predetermined distance.

As described above, according to an embodiment of the present invention, a patterning slit sheet is formed to be smaller than a substrate, and deposition is performed while the patterning slit sheet is moved relative to the substrate. Thus, the patterning slit sheet can be easily manufactured. In addition, defects that occur due to contact between a substrate and a FMM, in a conventional deposition method may be prevented or substantially prevented in the apparatus according to embodiments of the present invention. Furthermore, since it is unnecessary to dispose the mask in close contact with the substrate during a deposition process according to the present invention, the manufacturing time may be reduced.

Figure 7:
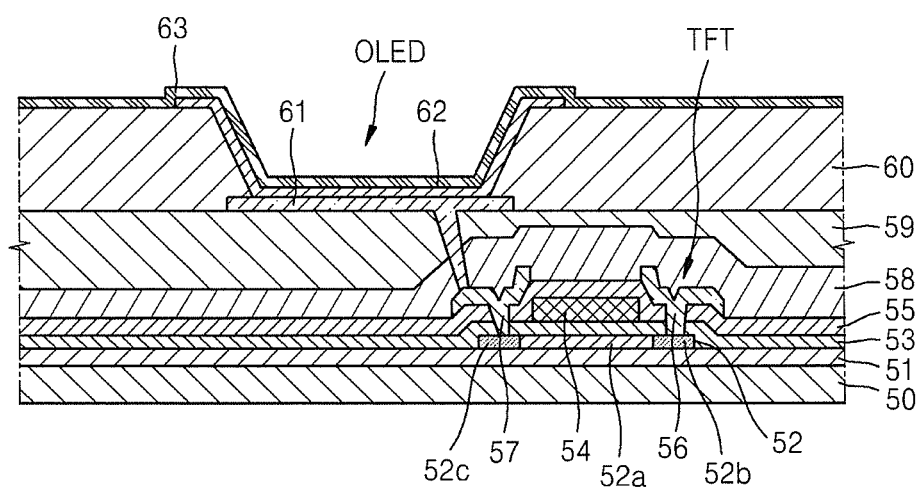
FIG. 7 is a cross-sectional view of an active matrix organic light-emitting display apparatus fabricated by using an organic layer deposition apparatus, according to an embodiment of the present invention.

FIG. 7 is a cross-sectional view of an active matrix organic light-emitting display apparatus fabricated by using an organic layer deposition apparatus, according to an embodiment of the present invention.

Referring to FIG. 7, in one embodiment, a buffer layer 51 is formed on a substrate 50 formed of glass or plastic. A TFT and an OLED are formed on the buffer layer 51.

An active layer 52 having a predetermined pattern is formed on the buffer layer 51. A gate insulating layer 53 is formed on the active layer 52, and a gate electrode 54 is formed in a predetermined region of the gate insulating layer 53. The gate electrode 54 is connected to a gate line (not shown) that applies a TFT ON/OFF signal. An interlayer insulating layer 55 is formed on the gate electrode 54. Source/drain electrodes 56 and 57 are formed so as to contact source/drain regions 52a and 52c, respectively, of the active layer 52 through contact holes. A passivation layer 58 is formed of $SiO_2$, $SiN_x$, or the like, on the source/drain electrodes 56 and 57. A planarization layer 59 is formed of an organic material, such as acryl, polyimide, benzocyclobutene (BCB), or the like, on the passivation layer 58. A pixel electrode 61, which functions as an anode of the OLED, is formed on the planarization layer 59, and a pixel defining layer 60 formed of an organic material is formed to cover the pixel electrode 61. An opening is formed in the pixel defining layer 60, and an organic layer 62 is formed on a surface of the pixel defining layer 60 and on a surface of the pixel electrode 61 exposed through the opening. The organic layer 62 includes an emission layer. However, the structure of the organic light-emitting display apparatus is not limited to the above, and any of various structures of organic light-emitting display apparatuses may be used.

The OLED displays predetermined image information by emitting red, green and blue light as current flows. The OLED includes the pixel electrode 61, which is connected to the drain electrode 56 of the TFT and to which a positive power voltage is applied, a counter electrode 63, which is formed so as to cover every pixel and to which a negative power voltage is applied, and the organic layer 62, which is disposed between the pixel electrode 61 and the counter electrode 63 to emit light.

The pixel electrode 61 and the counter electrode 63 are insulated from each other by the organic layer 62, and respectively apply voltages of opposite polarities to the organic layer 62 to induce light emission in the organic layer 62.

The organic layer 62 may include a low-molecular weight organic layer or a high-molecular weight organic layer. When a low-molecular weight organic layer is used as the organic layer 62, the organic layer 62 may have a single or multi-layer structure including at least one selected from the group consisting of a hole injection layer (HIL), a hole transport layer (HTL), an emission layer (EML), an electron transport layer (ETL), and an electron injection layer (EIL). Examples of available organic materials include copper phthalocyanine (CuPc), N,N'-di(naphthalene-1-yl)-N,N'-diphenyl-benzidine (NPB), tris-8-hydroxyquinoline aluminum (Alq3), and the like. The low-molecular weight organic layer may be formed by vacuum deposition.

When a high-molecular weight organic layer is used as the organic layer 62, the organic layer 62 may mostly have a structure including a HTL and an EML. In this case, the HTL may be formed of poly(ethylenedioxythiophene) (PEDOT), and the EML may be formed of polyphenylenevinylenes (PPVs) or polyfluorenes. The HTL and the EML may be formed by screen printing, inkjet printing, or the like.

However, the organic layer 62 is not limited to the organic layers described above, and may be embodied in various ways.

In one embodiment, the pixel electrode 61 functions as an anode, and the counter electrode 63 functions as a cathode. Alternatively, the pixel electrode 61 may function as a cathode, and the counter electrode 63 may function as an anode.

The pixel electrode 61 may be formed as a transparent electrode or a reflective electrode. Such a transparent electrode may be formed of indium tin oxide (ITO), indium zinc oxide (IZO), zinc oxide (ZnO), or indium oxide ($In_2O_3$). Such a reflective electrode may be formed by forming a reflective layer from silver (Ag), magnesium (Mg), aluminum (Al), platinum (Pt), palladium (Pd), gold (Au), nickel (Ni), neodymium (Nd), iridium (Ir), chromium (Cr) or a compound thereof and forming a layer of ITO, IZO, ZnO, or $In_2O_3$ on the reflective layer.

The counter electrode 63 may also be formed as a transparent electrode or a reflective electrode. When the counter electrode 63 is formed as a transparent electrode, the counter electrode 63 functions as a cathode. To this end, such a transparent electrode may be formed by depositing a metal having a low work function, such as lithium (Li), calcium (Ca), lithium fluoride/calcium (LiF/Ca), lithium fluoride/aluminum (LiF/Al), aluminum (Al), silver (Ag), magnesium (Mg), or a compound thereof on a surface of the organic layer 62 and forming an auxiliary electrode layer or a bus electrode line thereon by using a transparent electrode forming material, such as ITO, IZO, ZnO, $In_2O_3$, or the like. When the counter electrode 63 is formed as a reflective electrode, a reflective layer may be formed by depositing Li, LiF/Ca, LiF/Al, Al, Ag, Mg, or a compound thereof on the organic layer 62.

In the organic light-emitting display apparatus described above, the organic layer 62 including the emission layer may be formed by using the organic layer deposition apparatus 100 (see FIG. 1), which is described above. The organic layer deposition apparatuses according to the above embodiments of the present invention may be applied to form an organic or inorganic layer of an organic TFT, and to form layers from various materials.

As described above, the organic layer deposition apparatus according to aspects of the present invention may be easily manufactured, may be simply applied to the manufacture of large-sized display apparatuses on a mass scale, and may prevent or substantially prevent deposition source nozzles from being blocked with a deposition material, thereby improving manufacturing yield and deposition efficiency.

While the present invention has been particularly shown and described with reference to some exemplary embodiments thereof, it will be understood by those of ordinary skill in the art that various changes in form and details may be made therein without departing from the spirit and scope of the present invention as defined by the following claims.

What is claimed is:

1. A method of manufacturing an organic light-emitting display apparatus with a deposition source, the method comprising:
    arranging a substrate to face the deposition source; and
    discharging a deposition material from the deposition source onto the substrate;
    wherein the deposition source comprises:
    a first deposition source and a second deposition source arranged along a first direction;
    a first deposition source nozzle unit at side of the first deposition source and comprising a plurality of first deposition source nozzles arranged in the first direction;
    a second deposition source nozzle unit at a side of the second deposition source and comprising a plurality of second deposition source nozzles arranged in the first direction;
    a pair of first protruding reflectors arranged at opposite sides of the plurality of first deposition source nozzles, wherein the plurality of first deposition source nozzles are between the first protruding reflectors; and
    a pair of second protruding reflectors arranged at opposite sides of the plurality of second deposition source nozzles, wherein the plurality of second deposition source nozzles are between the second protruding reflectors,
    wherein first deposition source nozzles of the plurality of first deposition source nozzles and second deposition source nozzles of the plurality of second deposition source nozzles are arranged in a same row along the first direction, and
    wherein the plurality of first deposition source nozzles and the plurality of second deposition source nozzles are tilted toward each other, first deposition source nozzles of the plurality of first deposition source nozzles being tilted toward the first direction, and second deposition source nozzles of the plurality of second deposition source nozzles being tilted toward a direction opposite the first direction.

2. The method of claim 1, wherein a host material is discharged from the first deposition source and a dopant material is discharged from the second deposition source.

3. The method of claim 1, further comprising a third protruding reflector connecting one end of one of the first protruding reflectors and one end of the other of the first protruding reflectors.

4. The method of claim 3, wherein the one end of the one of the first protruding reflectors and the one end of the other of the first protruding reflectors are adjacent to the second deposition source.

5. The method of claim 1, further comprising a fourth protruding reflector connecting one end of one of the second protruding reflectors and one end of the other of the second protruding reflectors.

6. The method of claim 5, wherein the one end of the one of the second protruding reflectors and the one end of the other of the second protruding reflectors are adjacent to the first deposition source.

7. The method of claim 1, wherein heights of the first protruding reflectors are greater than or equal to heights of the first deposition source nozzles.

8. The method of claim 1, wherein heights of the second protruding reflectors are greater than or equal to heights of the second deposition source nozzles.

9. The method of claim 1, wherein a deposition source nozzle closest to the second deposition source from among the plurality of first deposition source nozzles is a dummy nozzle and does not have an aperture therein, such that a deposition material contained in the first deposition source is not dischargeable through the dummy nozzle.

10. The method of claim 1, wherein a deposition source nozzle closest to the first deposition source from among the plurality of second deposition source nozzles is a dummy nozzle and does not have an aperture therein, such that a deposition material contained in the second deposition source is not dischargeable through the dummy nozzle.

11. A method for manufacturing an organic light-emitting display apparatus by using an organic layer deposition apparatus for forming a thin film on a substrate, the method comprising:
    arranging the substrate to face the organic layer deposition apparatus: and
    discharging a deposition material by using the organic layer deposition apparatus onto the substrate;
    wherein the organic layer deposition apparatus comprises:
    a deposition source for discharging a deposition material;
    a deposition source nozzle unit at a side of the deposition source and comprising a plurality of deposition source nozzles arranged in a first direction; and
    a patterning slit sheet opposite the deposition source nozzle unit and having a plurality of patterning slits arranged in a second direction perpendicular to the first direction,
    wherein the substrate is movable relative to the organic layer deposition apparatus in the first direction for performing deposition,
    wherein the deposition source comprises a first deposition source and a second deposition source for discharging different materials, and
    wherein the deposition source nozzle unit comprises:
    a first deposition source nozzle unit at a side of the first deposition source and comprising a plurality of first deposition source nozzles arranged in the first direction; and a second deposition source nozzle unit at a side of the second deposition source and comprising a plurality of second deposition source nozzles arranged in the first direction, wherein first deposition source nozzles of the plurality of first deposition source nozzles and second deposition source nozzles of the plurality of second deposition source nozzles are arranged in a same row along the first direction, and wherein the plurality of first deposition source nozzles and the plurality of second deposition source nozzles are tilted at a predetermined angle, first deposition source nozzles, of the plurality of first deposition source nozzles being tilted toward the first direction, and second deposition source nozzles of the plurality of second deposition source nozzles being tilted toward a direction opposite the first direction.

12. The method of claim 11, wherein a host material is discharged from the first deposition source, and a dopant material is discharged from the second deposition source.

13. The method of claim 11, wherein the first and second deposition sources are arranged along the first direction.

14. The method of claim 11, wherein the first deposition source nozzle unit further comprises a first protruding reflector and a second protruding reflector arranged at opposite sides of the plurality of first deposition source nozzles, wherein the plurality of first deposition source nozzles are between the first and second protruding reflectors.

15. The method of claim 14, further comprising a third protruding reflector connecting one end of the first protruding reflector and one end of, the second protruding reflector.

16. The method of claim 15, wherein the one end of the first protruding reflector and the one end of the second protruding reflector are adjacent to the second deposition source.

17. The method of claim 14, wherein heights of the first and second protruding reflectors are greater than or equal to heights of the first deposition source nozzles.

18. The method of claim 14, wherein a deposition source nozzle closest to the second deposition source from among the plurality of first deposition source nozzles is a dummy nozzle and does not have an aperture therein, such that a deposition material contained in the first deposition source is not dischargeable through the dummy nozzle.

19. The method of claim 11, wherein the second deposition source nozzle unit further comprises a fourth protruding reflector and a fifth protruding reflector arranged at opposite sides of the plurality of second deposition source nozzles, wherein the plurality of second deposition source nozzles are between the fourth and fifth protruding reflectors.

20. The method of claim 19, further comprising a sixth protruding reflector connecting one end of the fourth protruding reflector and one end of the fifth protruding reflector.

21. The method of claim 20, wherein the one end of the fourth protruding reflector and the one end of the fifth protruding reflector are adjacent to the first deposition source.

22. The method of claim 19, wherein heights of the fourth and fifth protruding reflectors are greater than or equal to heights of the second deposition source nozzles.

23. The method of claim 19, wherein a deposition source nozzle closest to the first deposition source from among the plurality of second deposition source nozzles is a dummy nozzle and does not have an aperture therein, such that a deposition material contained in the second deposition source is not dischargeable through the dummy nozzle.

24. The method of claim 11, wherein the deposition source, the deposition source nozzle unit, and the patterning slit sheet are formed as one body.

25. The method of claim 11, further comprising at least one connection member connected between the deposition source nozzle unit and the patterning slit sheet, the at least one connection member being configured to guide movement of the deposition material.

26. The method of claim 25, wherein the at least one connection member is formed to seal a space between the deposition source, the deposition source nozzle unit, and the patterning slit sheet.

27. The method of claim 11, wherein the apparatus is spaced part from the substrate by a distance.

28. The method of claim 11, wherein the deposition material is continuously deposited on the substrate while the substrate is moved relative to the apparatus in the first direction.

29. The method of claim 11, wherein the patterning slit sheet is smaller than the substrate.

30. The method of claim 11, wherein at least one portion of a host material discharged from the first deposition source is mixed with at least one portion of a dopant material discharged from the second deposition source.

31. The method of claim 11, wherein the plurality of first deposition source nozzles and the plurality of second deposition source nozzles are tilted in such a manner that a mixture ratio of a host material discharged from the first deposition source and a dopant material discharged from the second deposition source is maintained constant throughout the entire substrate.

32. The method of claim 11, wherein the first and second deposition sources are linear deposition sources.

33. The method of clan 11, wherein lower end portions of deposition source nozzles of at least one of the plurality of first deposition source nozzles or the plurality of second deposition source nozzles have a curved surface.

* * * * *